US012666944B2

(12) United States Patent
Tsai et al.

(10) Patent No.: US 12,666,944 B2
(45) Date of Patent: Jun. 23, 2026

(54) SEMICONDUCTOR DEVICE STRUCTURE WITH CONDUCTIVE VIA STRUCTURE AND METHOD FOR FORMING THE SAME

(71) Applicant: Taiwan Semiconductor Manufacturing Company, Ltd., Hsinchu (TW)

(72) Inventors: Kuo-Chiang Tsai, Hsinchu City (TW); Jeng-Ya Yeh, New Taipei City (TW); Mu-Chi Chiang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 686 days.

(21) Appl. No.: 18/167,944

(22) Filed: Feb. 13, 2023

(65) Prior Publication Data

US 2024/0274525 A1      Aug. 15, 2024

(51) Int. Cl.
| | |
|---|---|
| *H01L 23/522* | (2006.01) |
| *H10D 64/23* | (2025.01) |
| *H10W 20/00* | (2026.01) |
| *H10W 20/42* | (2026.01) |

(52) U.S. Cl.
CPC .......... *H10W 20/42* (2026.01); *H10D 64/258* (2025.01); *H10W 20/033* (2026.01); *H10W 20/056* (2026.01); *H10W 20/082* (2026.01)

(58) Field of Classification Search
CPC ........... H01L 23/5226; H01L 21/76804; H01L 21/76843; H01L 21/76877; H01L 21/76879; H01L 21/76885; H01L 23/53238; H01L 23/53252; H01L 23/53266; H10D 64/258
See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |

(Continued)

*Primary Examiner* — Karen Kusumakar

(74) *Attorney, Agent, or Firm* — McClure, Qualey & Rodack, LLP

(57) ABSTRACT

A method for forming a semiconductor device structure is provided. The method includes providing a conductive structure. The method includes forming a first dielectric layer over the conductive structure. The method includes forming a conductive via structure that passes through the first dielectric layer. The conductive via structure is over and connected to the conductive structure, the conductive via structure has a first portion and a second portion over the first portion, and a first overall diffusion rate of the second portion in the first dielectric layer is lower than a second overall diffusion rate of the first portion in the first dielectric layer. The method includes forming a second dielectric layer over the conductive via structure and the first dielectric layer. The method includes forming a conductive line that passes through the second dielectric layer.

20 Claims, 34 Drawing Sheets

(56)                    References Cited

U.S. PATENT DOCUMENTS

| | | | |
|---|---|---|---|
| 11,270,910 B2* | 3/2022 | Reznicek | H01L 21/76844 |
| 11,842,924 B2* | 12/2023 | Tien | H01L 21/76897 |
| 2020/0144107 A1* | 5/2020 | Dutta | H01L 21/76816 |
| 2022/0028795 A1* | 1/2022 | Xu | H01L 21/76849 |

* cited by examiner

SEMICONDUCTOR DEVICE STRUCTURE WITH CONDUCTIVE VIA STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1A-1 is a perspective view of the semiconductor device structure of FIG. 1A, in accordance with some embodiments.

FIG. 1A-2 is a cross-sectional view illustrating the semiconductor device structure along a sectional line II-II' in FIG. 1A-1, in accordance with some embodiments.

FIG. 1A-3 is a cross-sectional view illustrating the semiconductor device structure along a sectional line III-III' in FIG. 1A-1, in accordance with some embodiments.

FIG. 1A-4 is a top view of the semiconductor device structure of FIG. 1A, in accordance with some embodiments.

FIG. 1B-1 is a top view of the semiconductor device structure of FIG. 1B, in accordance with some embodiments.

FIG. 1C-1 is a top view of the semiconductor device structure of FIG. 1C, in accordance with some embodiments.

FIG. 1F-1 is a top view of the semiconductor device structure of FIG. 1F, in accordance with some embodiments.

FIG. 1L-1 is a top view of the semiconductor device structure of FIG. 1L, in accordance with some embodiments.

FIG. 1L-2 is a cross-sectional view illustrating the semiconductor device structure along a sectional line II-II' in FIG. 1L-1, in accordance with some embodiments.

FIG. 1L-3 is a cross-sectional view illustrating the semiconductor device structure along a sectional line III-III' in FIG. 1L-1, in accordance with some embodiments.

FIG. 4 is a cross-sectional view of a semiconductor device structure, in accordance with some embodiments.

FIG. 5 is a cross-sectional view of a semiconductor device structure, in accordance with some embodiments.

DETAILED DESCRIPTION

Figure 1A:
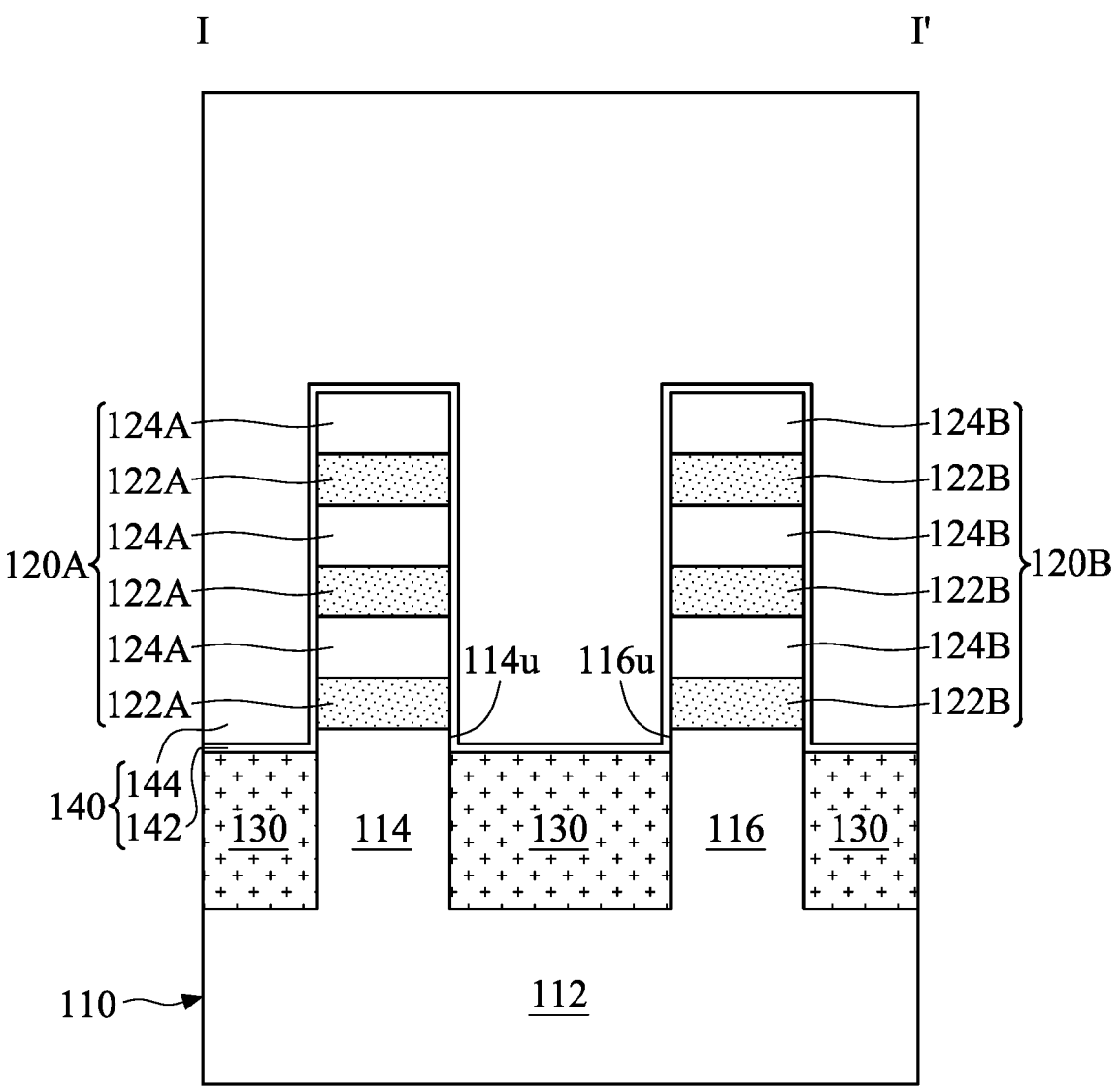
FIGS. 1A-1L are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The nanostructure transistor (e.g. nanosheet transistor, nanowire transistor, multi-bridge channel, nano-ribbon FET, gate all around (GAA) transistor structures) described below may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, smaller pitches than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure. Source/drain structure(s) may refer to a source or a drain, individually or collectively dependent upon the context.

Figures 1, 1A:
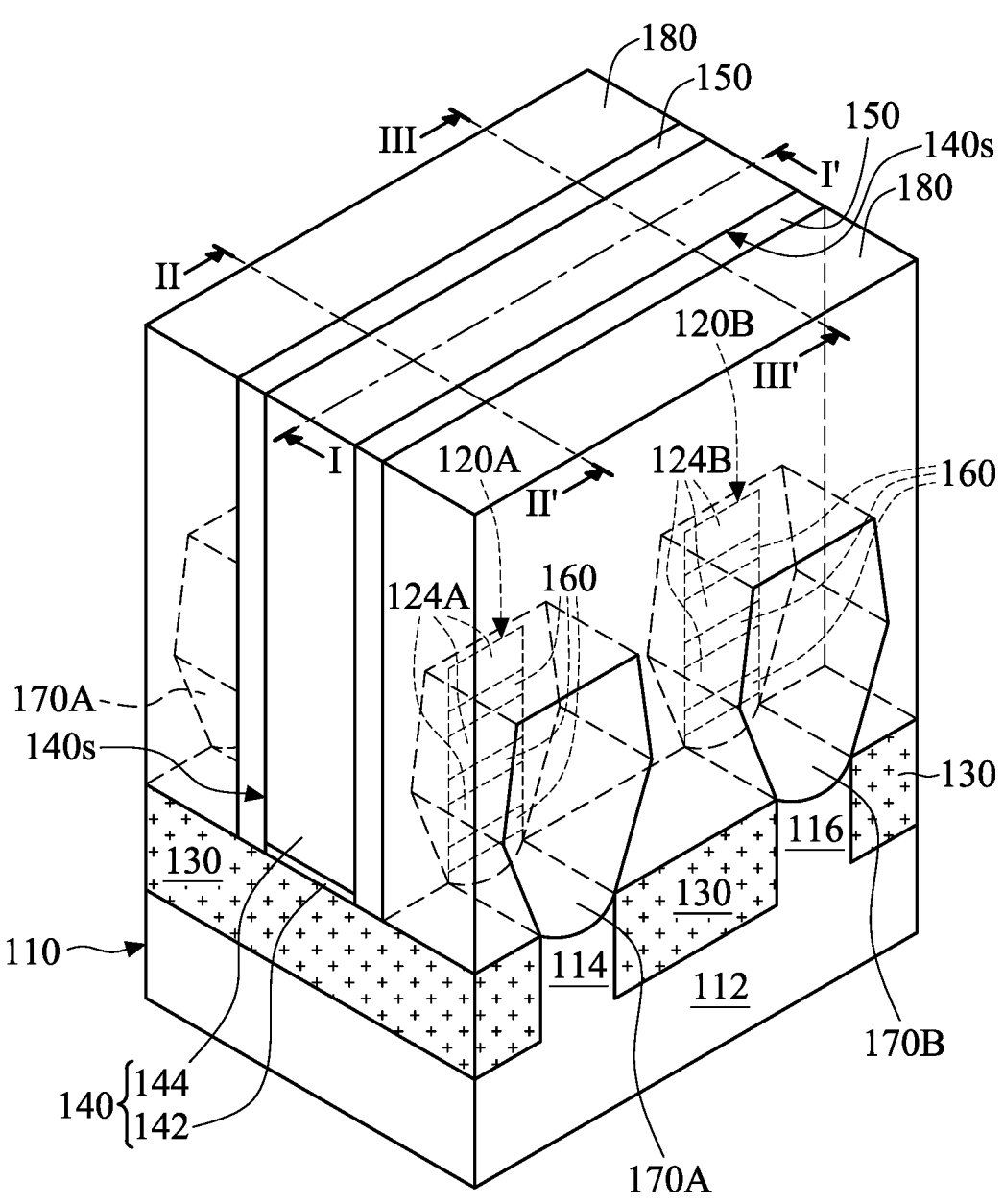

FIGS. 1A-1L are cross-sectional views of various stages of a process for forming a semiconductor device structure, in accordance with some embodiments. FIG. 1A-1 is a perspective view of the semiconductor device structure of FIG. 1A, in accordance with some embodiments.

As shown in FIGS. 1A and 1A-1, a substrate 110 is provided, in accordance with some embodiments. The substrate 110 has a base 112 and fins 114 and 116, in accordance with some embodiments. The fins 114 and 116 are over the base 112, in accordance with some embodiments.

The substrate 110 includes, for example, a semiconductor substrate. The semiconductor substrate includes, for example, a semiconductor wafer (such as a silicon wafer) or a portion of a semiconductor wafer. In some embodiments, the substrate 110 is made of an elementary semiconductor material including silicon or germanium in a single crystal, polycrystal, or amorphous structure.

In some other embodiments, the substrate 110 is made of a compound semiconductor, such as silicon carbide, gallium arsenide, gallium phosphide, indium phosphide, and/or indium arsenide, an alloy semiconductor, such as SiGe and/or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown). The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to define active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

Figures 1, 1A, 2, 3:
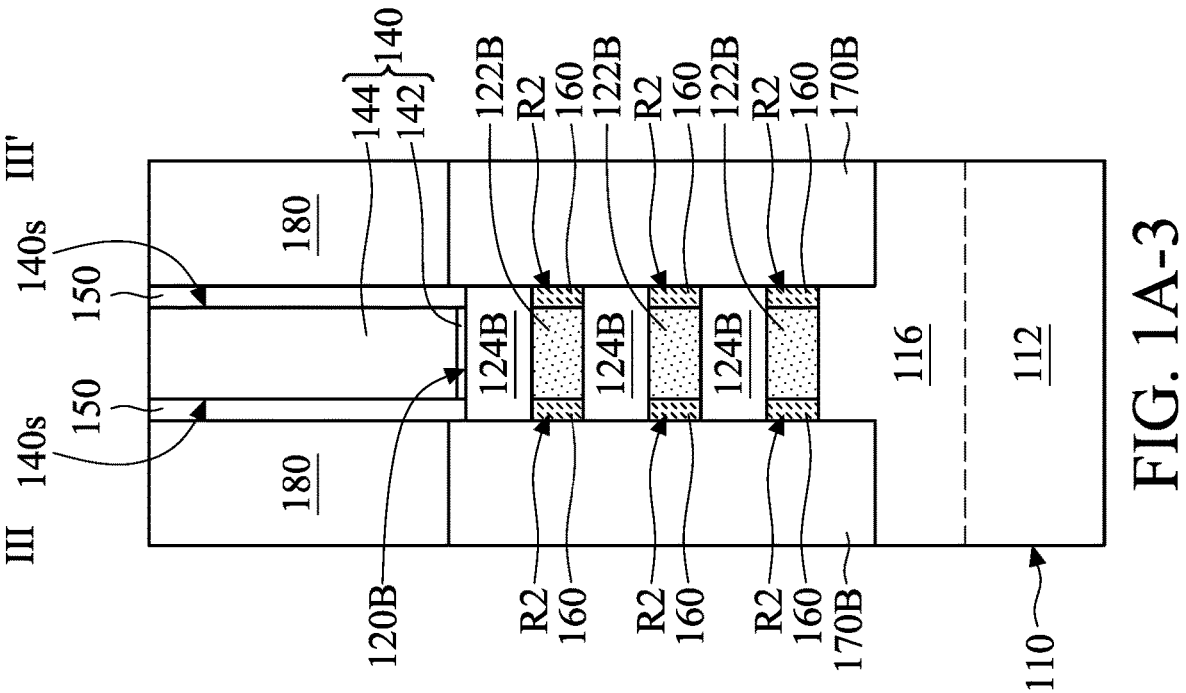
Figures 1, 1A, 2:
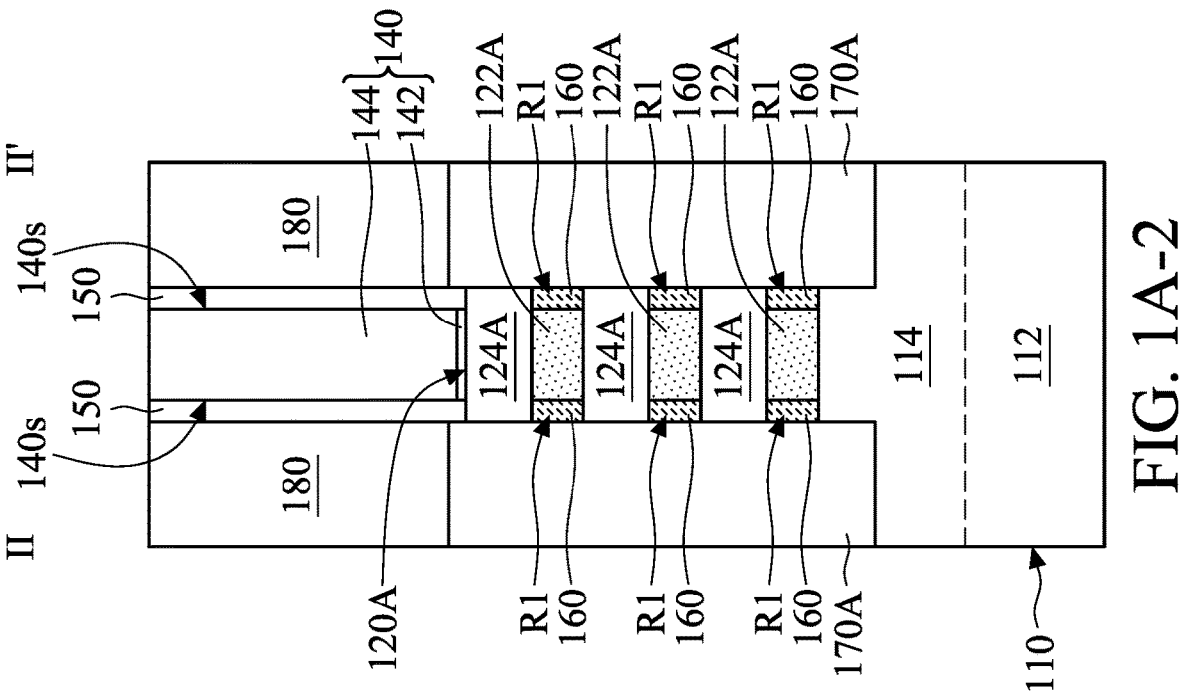

FIG. 1A-2 is a cross-sectional view illustrating the semiconductor device structure along a sectional line II-II' in FIG. 1A-1, in accordance with some embodiments. FIG. 1A-3 is a cross-sectional view illustrating the semiconductor device structure along a sectional line III-III' in FIG. 1A-1, in accordance with some embodiments.

As shown in FIGS. 1A, 1A-1, 1A-2, and 1A-3, nanostructure stacks 120A and 120B are formed over the fins 114 and 116 respectively, in accordance with some embodiments. The nanostructure stack 120A includes sacrificial nanostructures 122A and channel nanostructures 124A, in accordance with some embodiments. The sacrificial nanostructures 122A and the channel nanostructures 124A are alternately arranged as illustrated in FIG. 1A, in accordance with some embodiments.

It should be noted that, for the sake of simplicity, FIG. 1A shows three sacrificial nanostructures 122A and three channel nanostructures 124A for illustration, but does not limit the invention thereto. In some embodiments, the number of the sacrificial nanostructures 122A or the channel nanostructures 124A is between 2 and 10.

The sacrificial nanostructures 122A are made of a first material, such as a first semiconductor material, in accordance with some embodiments. The channel nanostructures 124A are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial nanostructures 122A are made of SiGe, and the channel nanostructures 124A are made of Si.

In some other embodiments, the sacrificial nanostructures 122A or the channel nanostructures 124A are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof.

The channel nanostructures 124A, the fin 114, and the base 112 are made of the same material such as Si, and the sacrificial nanostructures 122A and the fin 114 (or the base 112) are made of different materials, in accordance with some embodiments. In some other embodiments, the sacrificial nanostructures 122A, the channel nanostructures 124A, and the fin 114 (or the base 112) are made of different materials, in accordance with some embodiments. The sacrificial nanostructures 122A and the channel nanostructures 124A are formed using a molecular beam epitaxy (MBE) process, a metal-organic chemical vapor deposition (MOCVD) process, and/or another suitable epitaxial growth process.

The nanostructure stack 120B includes sacrificial nanostructures 122B and channel nanostructures 124B, in accordance with some embodiments. The sacrificial nanostructures 122B and the channel nanostructures 124B are alternately arranged as illustrated in FIG. 1A, in accordance with some embodiments.

It should be noted that, for the sake of simplicity, FIG. 1A shows three sacrificial nanostructures 122B and three channel nanostructures 124B for illustration, but does not limit the invention thereto. In some embodiments, the number of the sacrificial nanostructures 122B or the channel nanostructures 124B is between 2 and 10.

The sacrificial nanostructures 122B are made of a first material, such as a first semiconductor material, in accordance with some embodiments. The channel nanostructures 124B are made of a second material, such as a second semiconductor material, in accordance with some embodiments.

The first material is different from the second material, in accordance with some embodiments. The first material has an etch selectivity with respect to the second material, in accordance with some embodiments. In some embodiments, the sacrificial nanostructures 122B are made of SiGe, and the channel nanostructures 124B are made of Si.

In some other embodiments, the sacrificial nanostructures 122B or the channel nanostructures 124B are made of other materials such as germanium, a compound semiconductor such as silicon carbide, gallium arsenide, gallium phosphide, indium phosphide, indium arsenide, and/or indium antimonide, an alloy semiconductor such as GaAsP, AlInAs, AlGaAs, InGaAs, GaInP, and/or GaInAsP, or a combination thereof.

The channel nanostructures 124B, the fin 116, and the base 112 are made of the same material such as Si, and the sacrificial nanostructures 122B and the fin 116 (or the base 112) are made of different materials, in accordance with some embodiments. In some other embodiments, the sacrificial nanostructures 122B, the channel nanostructures 124B, and the fin 116 (or the base 112) are made of different materials, in accordance with some embodiments. The sacrificial nanostructures 122A and 122B are made of the same material such as SiGe, in accordance with some embodiments. The channel nanostructures 124A and 124B are made of the same material such as Si, in accordance with some embodiments.

The sacrificial nanostructures 122B and the channel nanostructures 124B are formed using a molecular beam epitaxy (MBE) process, a metal-organic chemical vapor deposition (MOCVD) process, and/or another suitable epitaxial growth process.

As shown in FIGS. 1A and 1A-1, an isolation layer 130 is formed over the base 112, in accordance with some embodiments. The isolation layer 130 surrounds the fins 114 and 116, in accordance with some embodiments. The isolation layer 130 is made of oxide (such as silicon oxide), fluorosilicate glass (FSG), a low-k dielectric material, and/or another suitable dielectric material. The isolation layer 130 may be formed by an atomic layer deposition (ALD) process, a chemical vapor deposition (CVD) process, or another applicable process.

As shown in FIGS. 1A and 1A-1, a gate stack structure 140 is formed over the fins 114 and 116, the nanostructure stacks 120A and 120B, and the isolation layer 130, in accordance with some embodiments. The gate stack structure 140 is wrapped around the nanostructure stacks 120A and 120B and upper portions 114u and 116u of the fins 114 and 116, in accordance with some embodiments.

The gate stack structure 140 includes a gate dielectric layer 142 and a semiconductor layer 144, in accordance with some embodiments. The gate dielectric layer 142 and the semiconductor layer 144 are sequentially stacked over the fins 114 and 116 and the nanostructure stacks 120A and 120B, in accordance with some embodiments.

The gate dielectric layer 142 conformally covers the fins 114 and 116, the nanostructure stacks 120A and 120B, and the isolation layer 130, in accordance with some embodiments. The gate dielectric layer 142 is made of an insulating material, such as oxide (e.g., silicon oxide), in accordance with some embodiments. The semiconductor layer 144 is made of a semiconductor material (e.g. polysilicon) or a conductive material (e.g., metal or alloy), in accordance with some embodiments.

As shown in FIGS. 1A-1, 1A-2, and 1A-3, a spacer layer 150 is formed over sidewalls 140s of the gate stack structure 140, in accordance with some embodiments. In some embodiments, as shown in FIGS. 1A-1, 1A-2, and 1A-3, the spacer layer 150 is a single-layered structure. In some other embodiments (not shown), the spacer layer 150 is a multi-layered structure. The spacer layer 150 includes layers, in accordance with some embodiments. The layers are made of different materials, in accordance with some embodiments.

In some embodiments, the spacer layer 150 is made of a nitride-containing insulating material or a carbon-containing insulating material, in accordance with some embodiments. The spacer layer 150 is made of silicon nitride (SiN), silicon oxynitride (SiON), silicon oxycarbide (SiOC), silicon oxycarbonitride (SiOCN), or silicon carbonitride (SiCN), in accordance with some embodiments.

The spacer layer 150 is formed using a deposition process and an etching process, in accordance with some embodiments. The deposition process includes a chemical vapor deposition (CVD) process, an atomic layer deposition (ALD) process, or a physical vapor deposition (PVD) process, in accordance with some embodiments.

As shown in FIG. 1A-2 and, portions of the sacrificial nanostructures 122A are removed to form recesses R1 in the nanostructure stack 120A, in accordance with some embodiments. The recess R1 is surrounded by the corresponding sacrificial nanostructure 122A and the corresponding channel nanostructures 124A, in accordance with some embodiments.

As shown in FIG. 1A-3, portions of the sacrificial nanostructures 122B are removed to form recesses R2 in the nanostructure stack 120B, in accordance with some embodiments. The recess R2 is surrounded by the corresponding sacrificial nanostructure 122B and the corresponding channel nanostructures 124B, in accordance with some embodiments. The removal process includes an etching process, such as an isotropic etching process (e.g., a dry etching process or a wet etching process), in accordance with some embodiments.

As shown in FIGS. 1A-1, 1A-2, and 1A-3, an inner spacer layer 160 is formed in the recesses R1 and R2, in accordance with some embodiments. In some embodiments, the inner spacer layer 160 is made of an oxide-containing insulating material, such as silicon oxide.

In some other embodiments, the inner spacer layer 160 is made of a nitride-containing insulating material, such as silicon nitride (SiN), silicon oxynitride (SiON), silicon oxycarbonitride (SiOCN), or silicon carbonitride (SiCN). The inner spacer layer 160 is formed using a deposition process and an etching process, in accordance with some embodiments. The deposition process includes a chemical vapor deposition process or a physical vapor deposition process, in accordance with some embodiments.

FIG. 1A-4 is a top view of the semiconductor device structure of FIG. 1A, in accordance with some embodiments. FIG. 1A is a cross-sectional view illustrating the semiconductor device structure along a sectional line I-I' in FIG. 1A-1 or 1A-4, in accordance with some embodiments.

As shown in FIGS. 1A-1, 1A-2, 1A-3, and 1A-4, source/drain structures 170A are formed over the fin 114, in accordance with some embodiments. The source/drain structures 170A are in direct contact with the fin 114 and the channel nanostructures 124A, in accordance with some embodiments.

In some other embodiments, the source/drain structures 170A are made of a semiconductor material (e.g., silicon) with N-type dopants, such as the Group VA element, in accordance with some embodiments. The Group VA element includes phosphor (P), antimony (Sb), or another suitable Group VA material. The source/drain structures 170A are formed using an epitaxial process, in accordance with some embodiments.

As shown in FIGS. 1A-1, 1A-2, and 1A-3, source/drain structures 170B are formed over the fin 116, in accordance with some embodiments. The source/drain structures 170B are in direct contact with the fin 116 and the channel nanostructures 124B, in accordance with some embodiments.

In some embodiments, the source/drain structures 170B are made of a semiconductor material (e.g., silicon germanium) with P-type dopants, such as the Group IIIA element, in accordance with some embodiments. The Group IIIA element includes boron or another suitable material.

The source/drain structures 170A and 170B are made of different materials, in accordance with some embodiments. The source/drain structures 170A and 170B are formed using different epitaxial growth processes, in accordance with some embodiments.

For example, the formation of the source/drain structures 170A and 170B includes forming a first mask layer (not shown) over the fin 116; forming the source/drain structures 170A over the fin 114; removing the first mask layer; forming a second mask layer (not shown) over the source/drain structures 170A; forming the source/drain structures 170B over the fin 116; and removing the second mask layer.

As shown in FIGS. 1A-1, 1A-2, and 1A-3, a dielectric layer 180 is formed over the source/drain structures 170A and 170B and the isolation layer 130, in accordance with some embodiments. The dielectric layer 180 is wrapped around the gate stack structure 140 and the spacer layer 150, in accordance with some embodiments.

The dielectric layer 180 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

The dielectric layer 180 is formed using a deposition process and a removal process, in accordance with some embodiments. The deposition process includes an atomic layer deposition (ALD) process, a chemical vapor deposition (CVD) process, or another applicable process. The removal process includes a planarization process, such as a chemical mechanical polishing process, in accordance with some embodiments.

In some embodiments, the dielectric layer 180 includes a multi-layered structure. The dielectric layer 180 includes a thin film and a dielectric film over the thin film, in accordance with some embodiments. The thin film is made of a nitride-containing insulating material such as silicon nitride, in accordance with some embodiments.

The dielectric film is made of an oxide-containing insulating material such as silicon oxide, in accordance with some embodiments. The thin film is formed using an atomic layer deposition (ALD) process, in accordance with some embodiments. The dielectric film is formed using a chemical vapor deposition (CVD) process, in accordance with some embodiments.

Figures 1, 1A, 2, 3, 4:
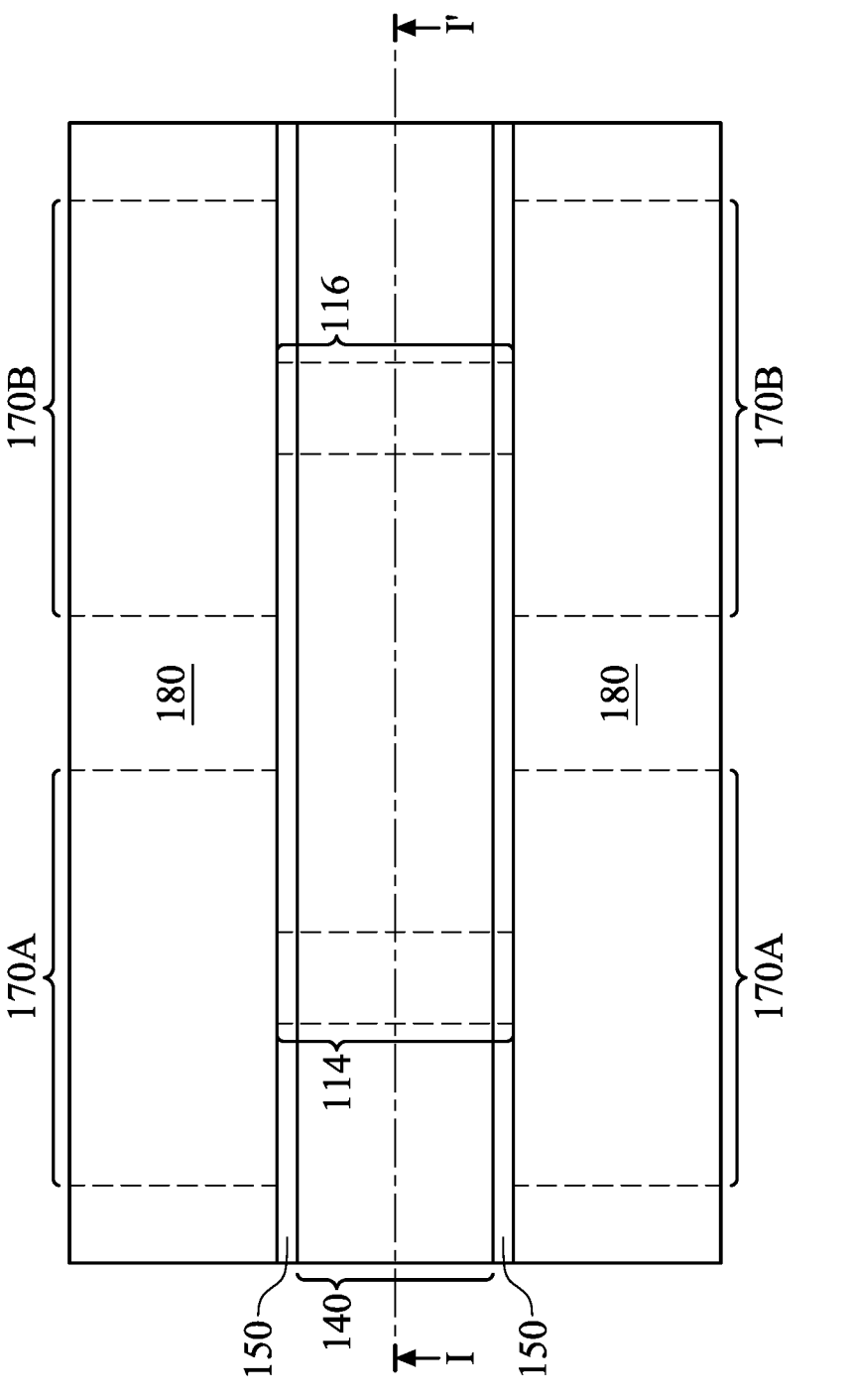
Figure 1B:
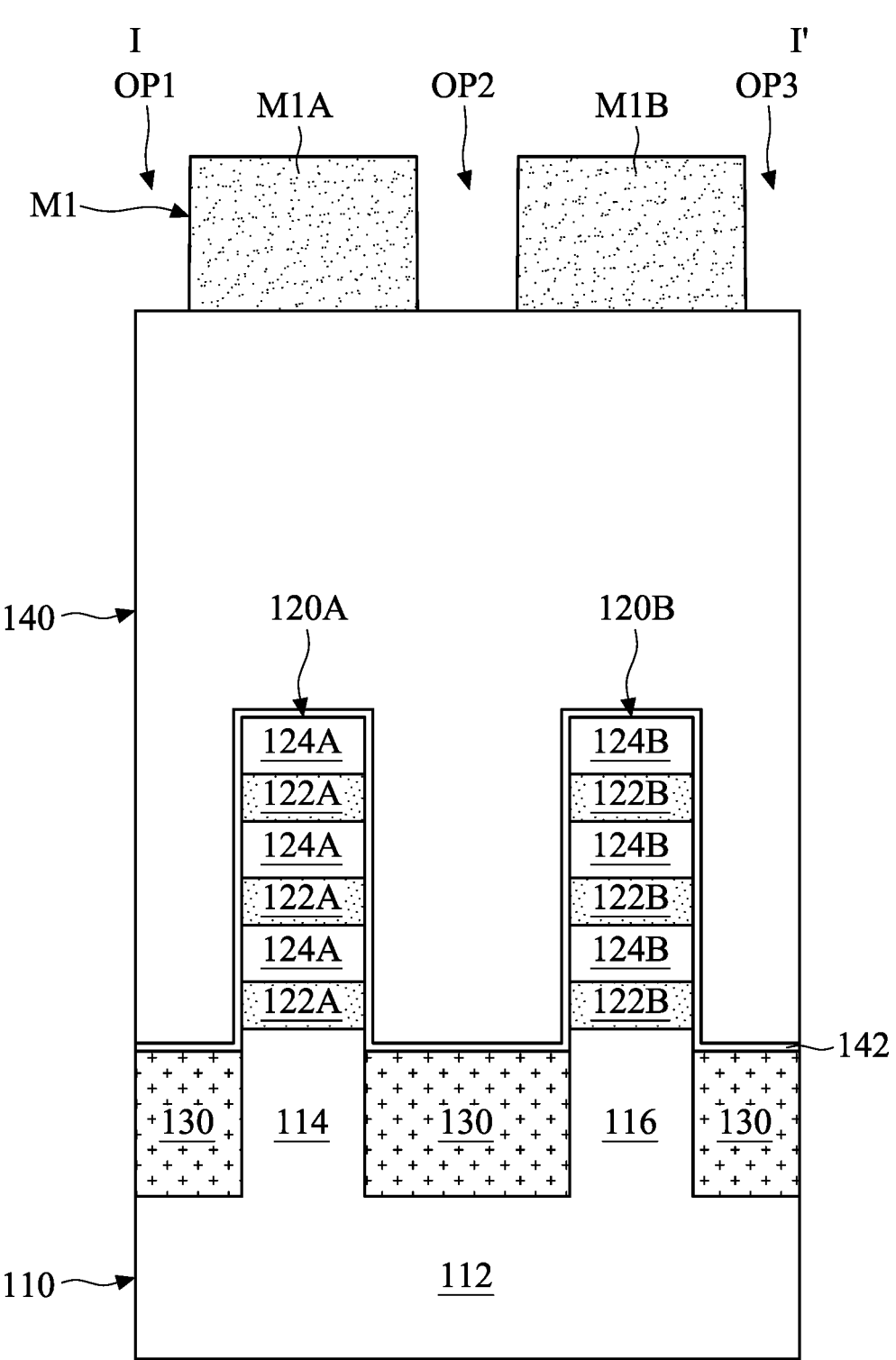
Figures 1, 1B:
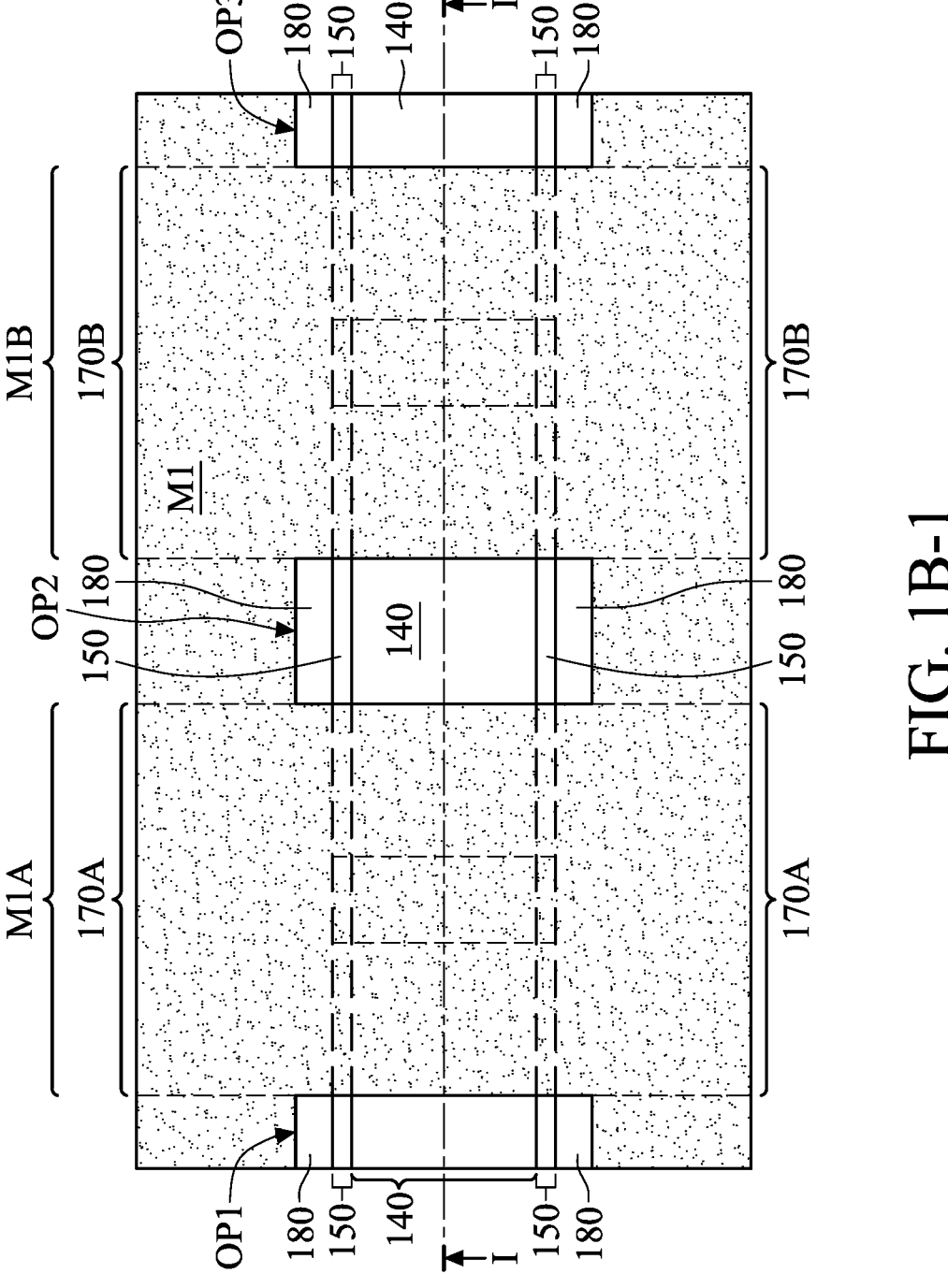

FIG. 1B-1 is a top view of the semiconductor device structure of FIG. 1B, in accordance with some embodiments. FIG. 1B is a cross-sectional view illustrating the semiconductor device structure along a sectional line I-I' in FIG. 1B-1, in accordance with some embodiments.

As shown in FIGS. 1B and 1B-1, a mask layer M1 is formed over the gate stack structure 140, in accordance with some embodiments. The mask layer M1 has openings OP1, OP2, and OP3, in accordance with some embodiments. The openings OP1, OP2, and OP3 expose portions of the gate stack structure 140, in accordance with some embodiments.

The mask layer M1 has portions M1A and M1B, in accordance with some embodiments. The portion M1A is between the openings OP1 and OP2, in accordance with some embodiments. The portion M1B is between the openings OP2 and OP3, in accordance with some embodiments. The mask layer M1 is made of a polymer material such as a photoresist material, in accordance with some embodiments.

Figure 1C:
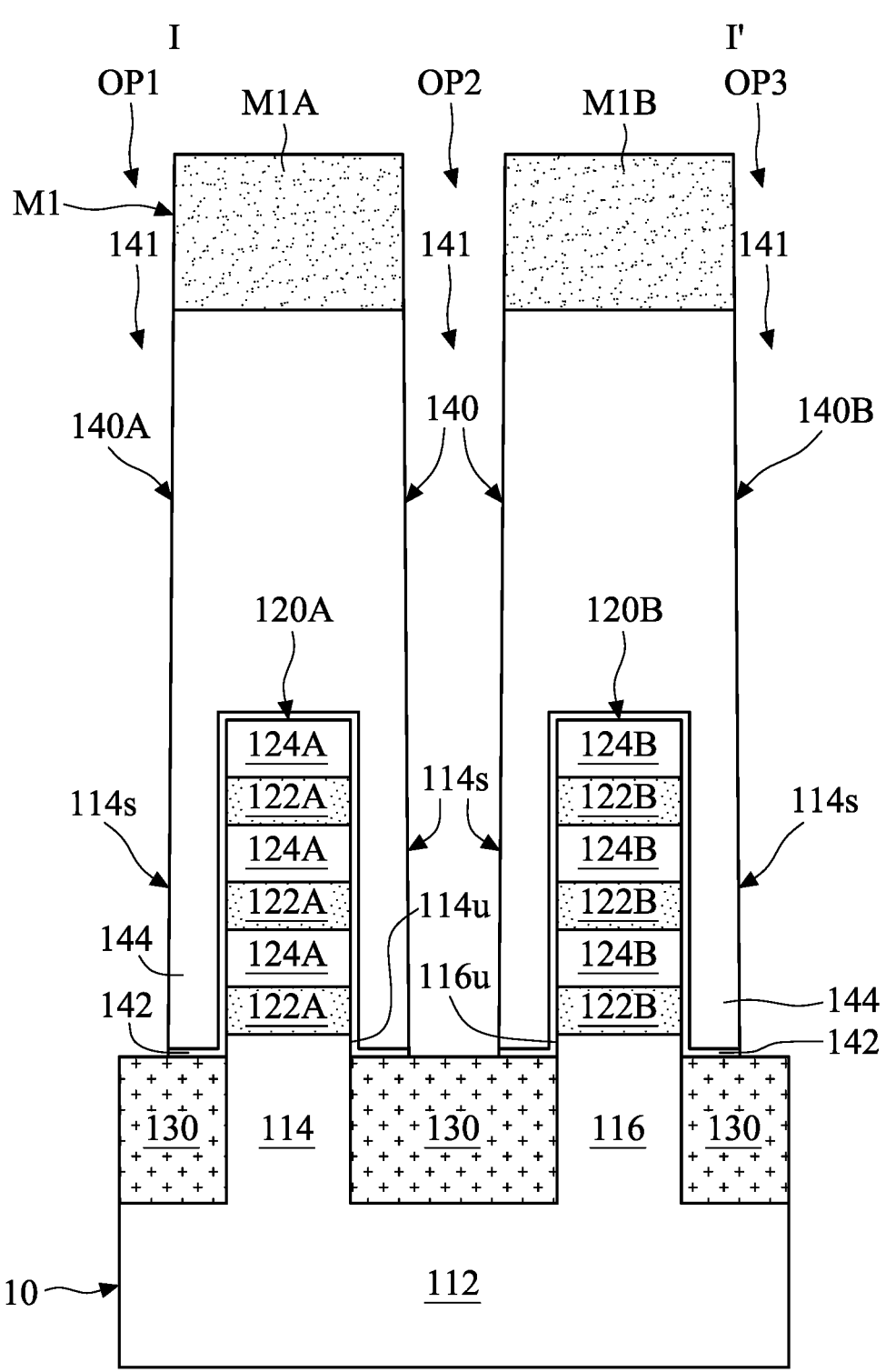
Figures 1, 1C:
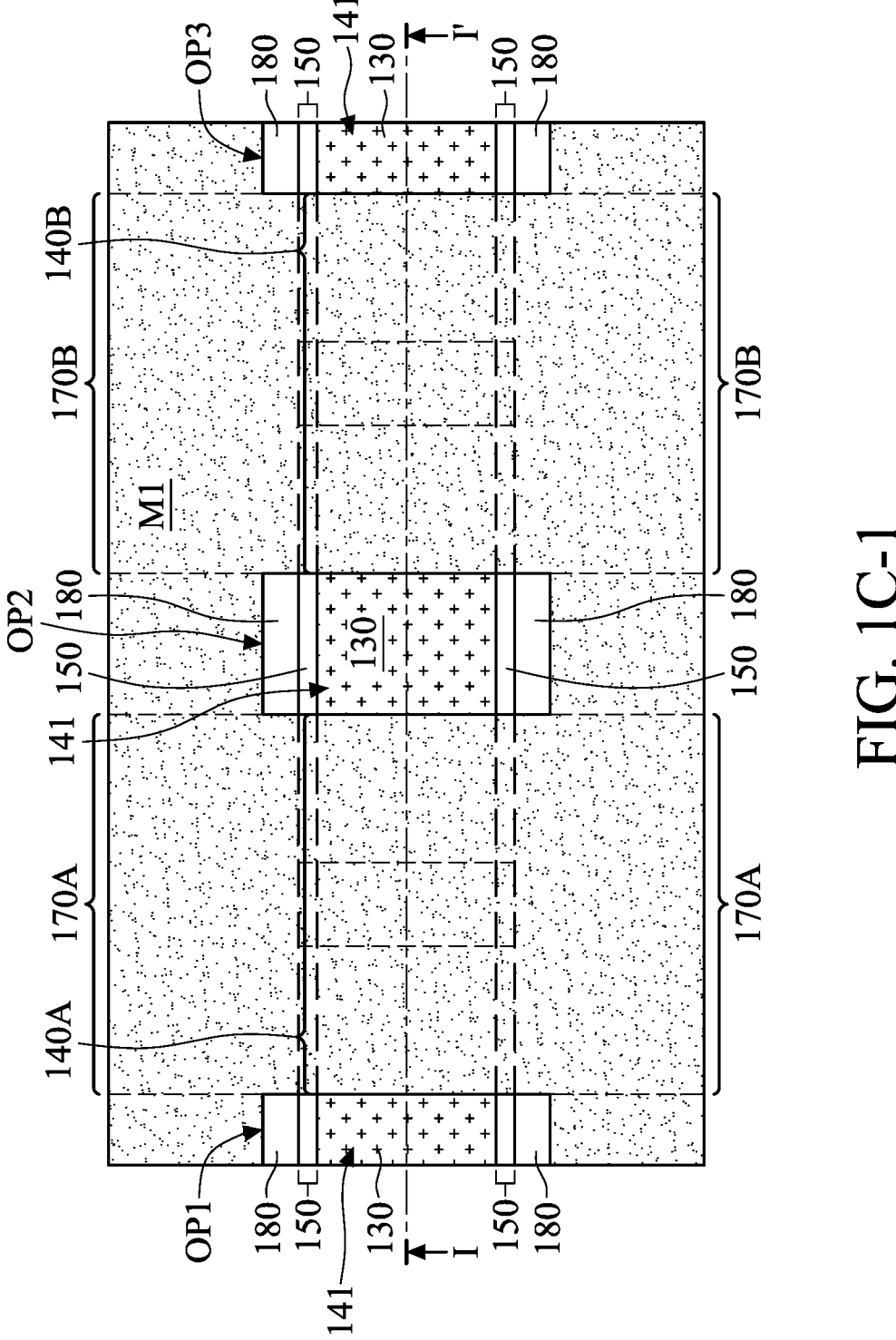

FIG. 1C-1 is a top view of the semiconductor device structure of FIG. 1C, in accordance with some embodiments. FIG. 1C is a cross-sectional view illustrating the semiconductor device structure along a sectional line I-I' in FIG. 1C-1, in accordance with some embodiments. As shown in FIGS. 1C and 1C-1, portions of the gate stack structure 140 are removed through the openings OP1, OP2, and OP3 of the mask layer M1 to form trenches 141 in the gate stack structure 140, in accordance with some embodiments.

The gate stack structure 140 is divided into gate stacks 140A and 140B by the trenches 141, in accordance with some embodiments. The gate stacks 140A and 140B are between the trenches 141, in accordance with some embodiments. The gate stack 140A is wrapped around the nanostructure stack 120A and the upper portion 114u of the fin 114, in accordance with some embodiments. The gate stack 140B is wrapped around the nanostructure stack 120B and the upper portion 116u of the fin 116, in accordance with some embodiments. The inner walls 114s of the trenches 141 are inclined walls, in accordance with some embodiments.

Figure 1D:
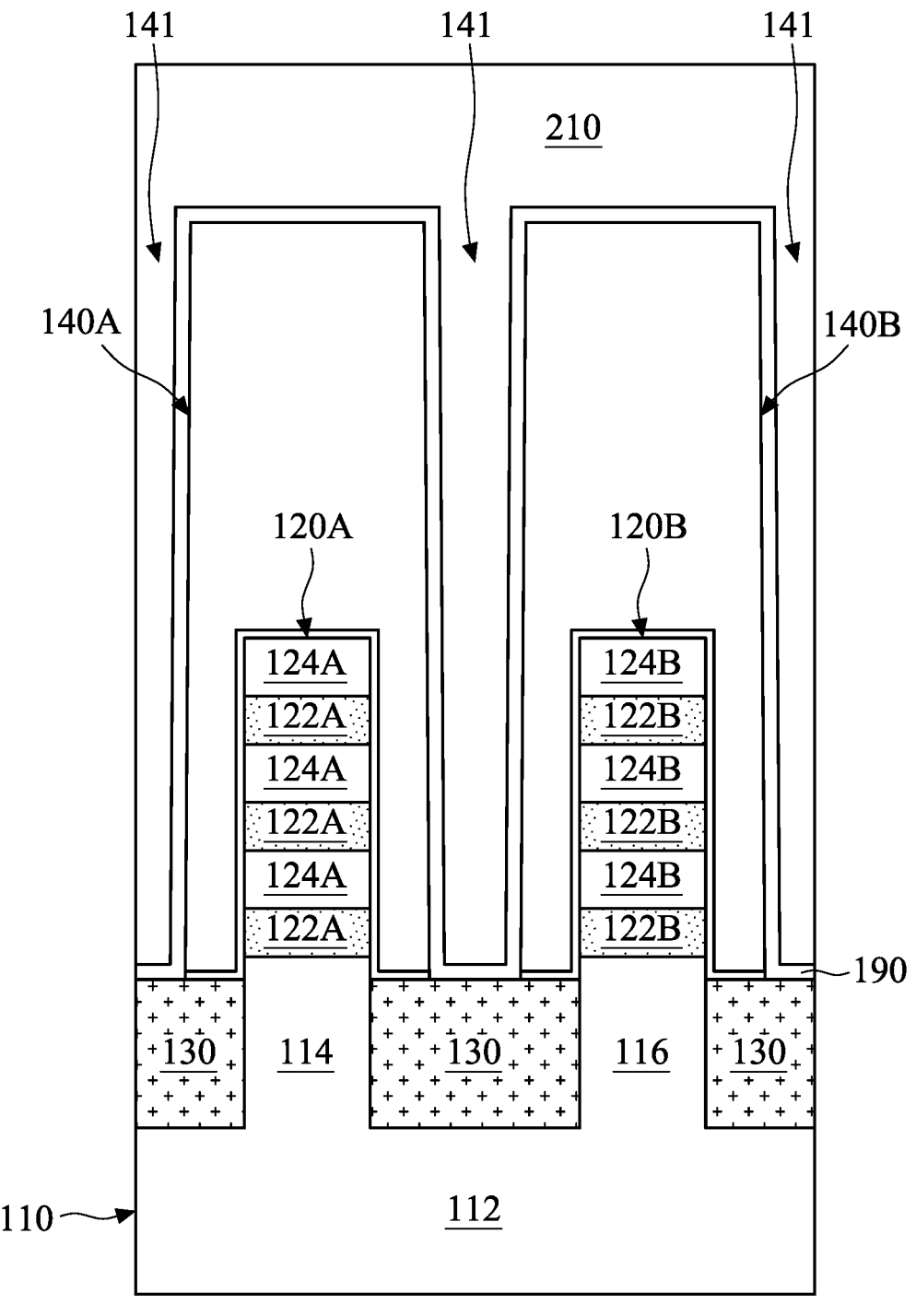

As shown in FIG. 1D, a protective layer 190 is conformally formed over the gate stacks 140A and 140B and the isolation layer 130, in accordance with some embodiments. The protective layer 190 is used to protect the gate stacks 140A and 140B from oxidation, in accordance with some embodiments.

The protective layer 190 is made of nitrides such as silicon nitride, in accordance with some embodiments. The protective layer 190 is formed using an atomic layer deposition (ALD) process, a chemical vapor deposition (CVD) process, a physical vapor deposition (PVD) process, or another applicable process.

As shown in FIG. 1D, an isolation structure 210 is formed over the protective layer 190, in accordance with some embodiments. The isolation structure 210 is made of oxide (such as silicon oxide), fluorosilicate glass (FSG), a low-k dielectric material, and/or another suitable dielectric material. The isolation structure 210 may be formed by an atomic layer deposition (ALD) process, a chemical vapor deposition (CVD) process, or another applicable process.

Figure 1E:
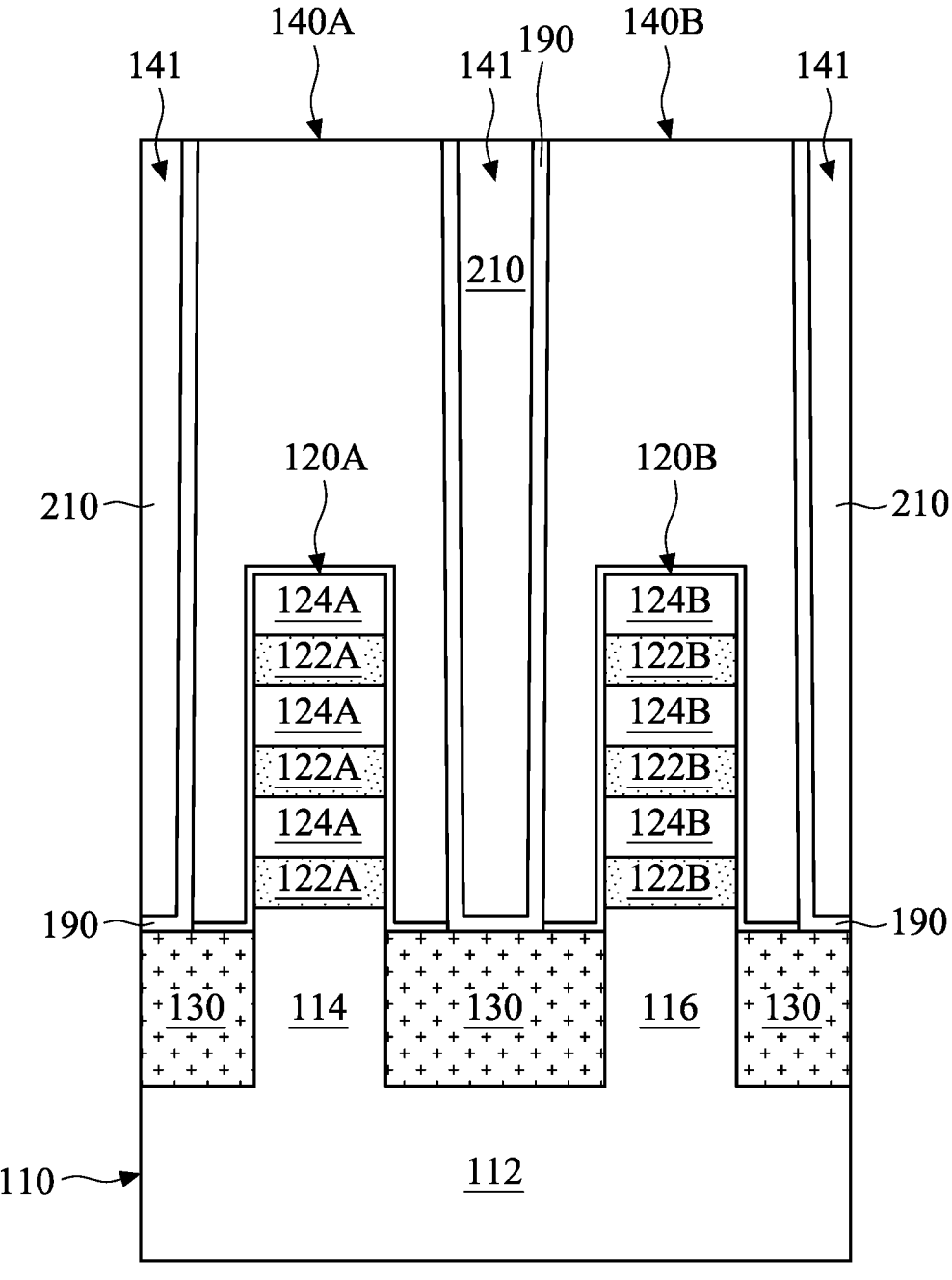

As shown in FIG. 1E, top portions of the protective layer 190 and the isolation structure 210, which are outside of the trenches 141 of the gate stack structure 140, are removed, in accordance with some embodiments. The removal process includes a planarization process such as a chemical mechanical polishing (CMP) process, in accordance with some embodiments.

Figure 1F:
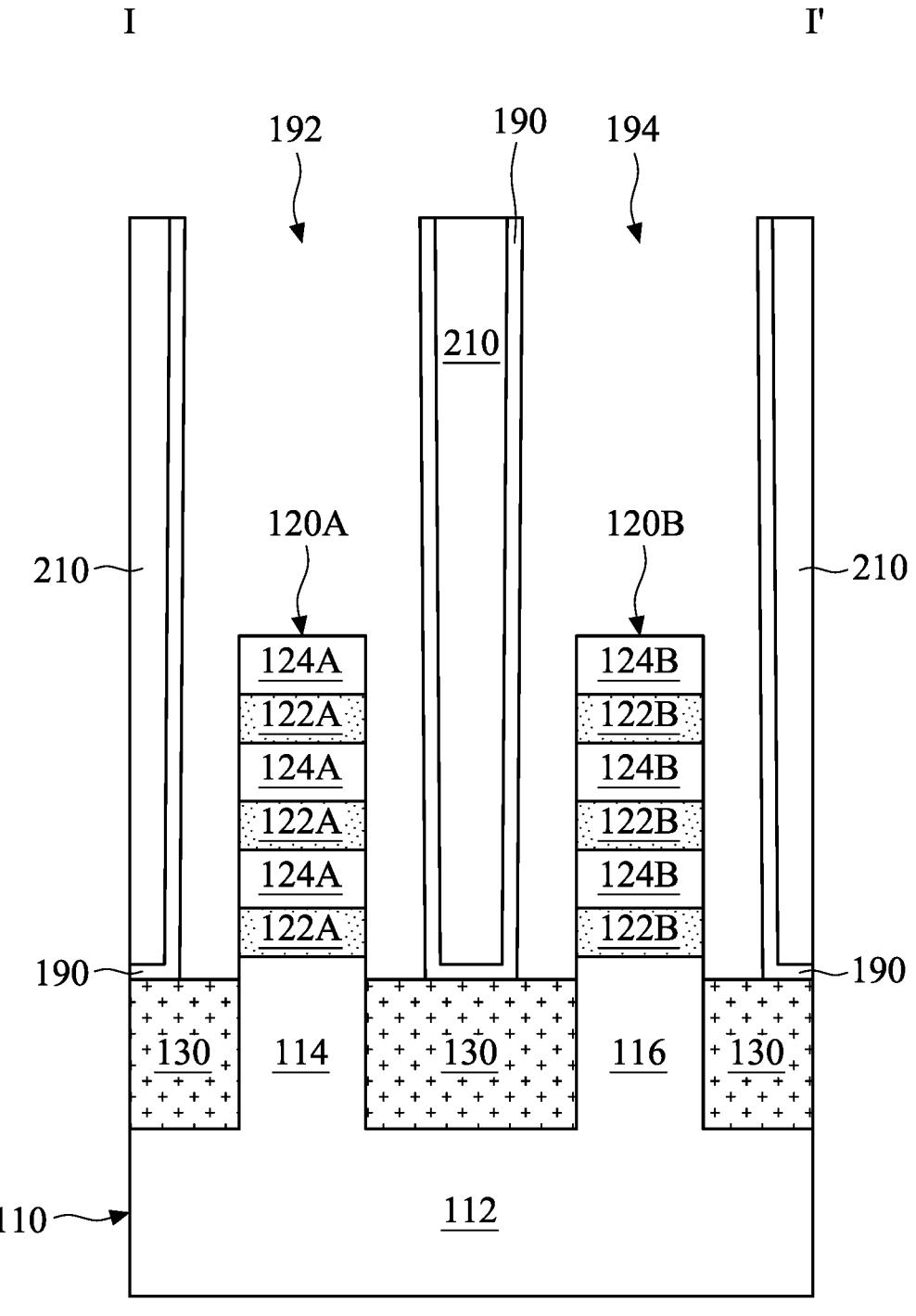
Figures 1, 1F:
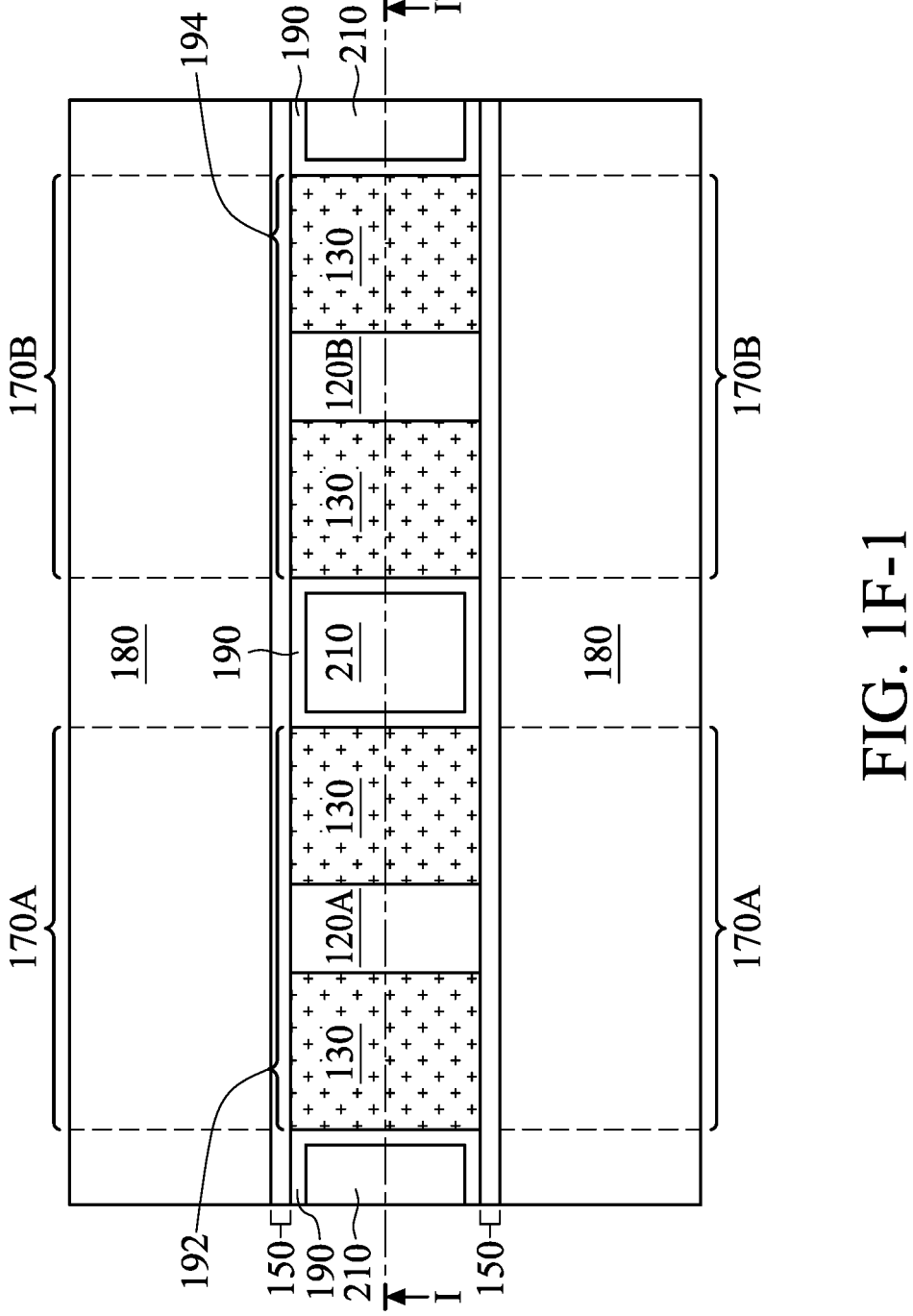

FIG. 1F-1 is a top view of the semiconductor device structure of FIG. 1F, in accordance with some embodiments. FIG. 1F is a cross-sectional view illustrating the semiconductor device structure along a sectional line I-I' in FIG. 1F-1, in accordance with some embodiments.

As shown in FIGS. 1F and 1F-1, the gate stacks 140A and 140B are removed to form recesses 192 and 194 in the protective layer 190, the dielectric layer 180, and the spacer layer 150, in accordance with some embodiments. The removal process includes an etching process such as a dry etching process or a wet etching process, in accordance with some embodiments.

Figure 1G:
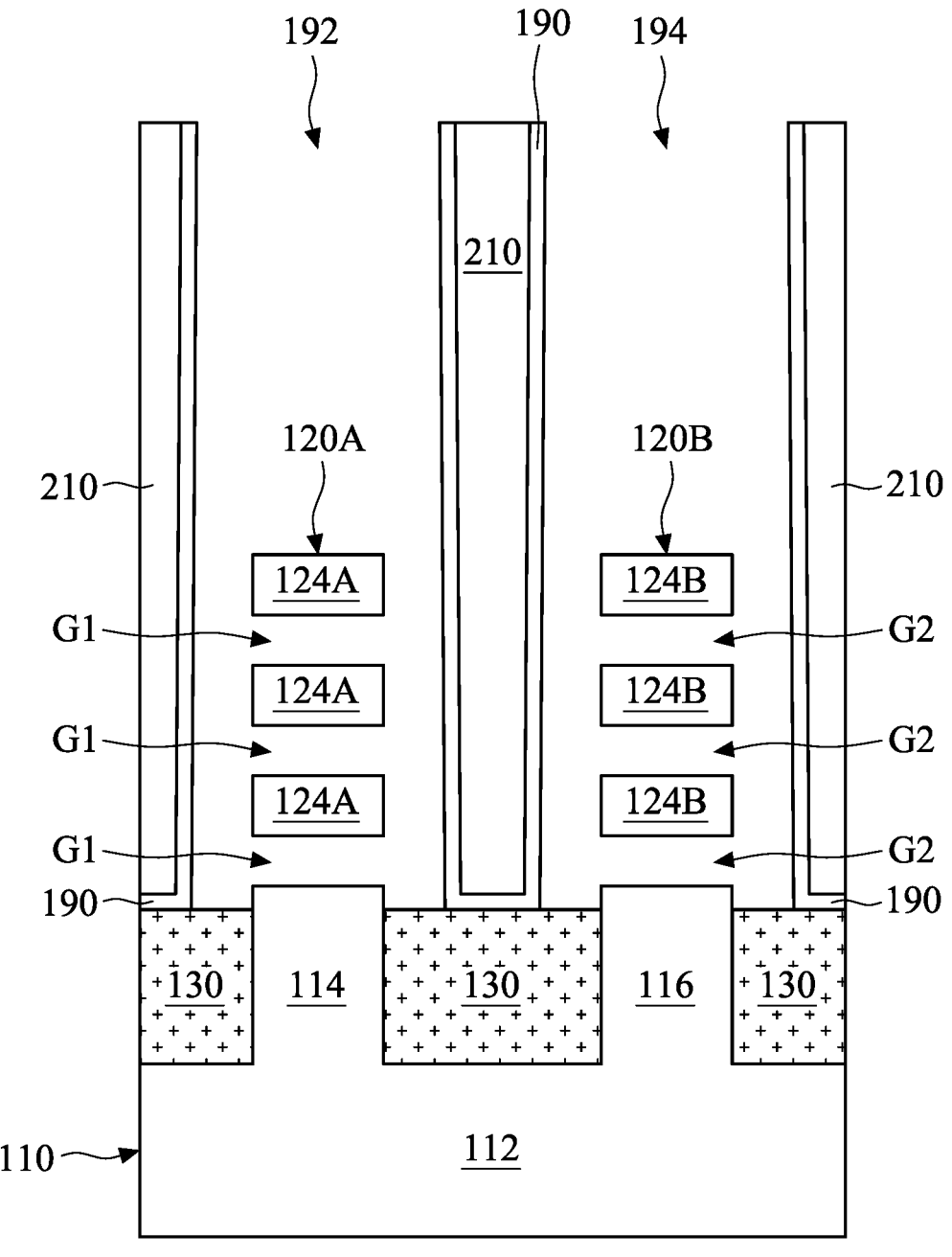

As shown in FIGS. 1F and 1G, the sacrificial nanostructures 122A and 122B are removed through the recesses 192 and 194 of the protective layer 190 respectively, in accordance with some embodiments. The removal process forms gaps G1 between the nanostructures 124A and the fin 114, in accordance with some embodiments.

The removal process forms gaps G2 between the nanostructures 124B and the fin 116, in accordance with some embodiments. The removal process includes an etching process such as a wet etching process or a dry etching process, in accordance with some embodiments.

Figure 1H:
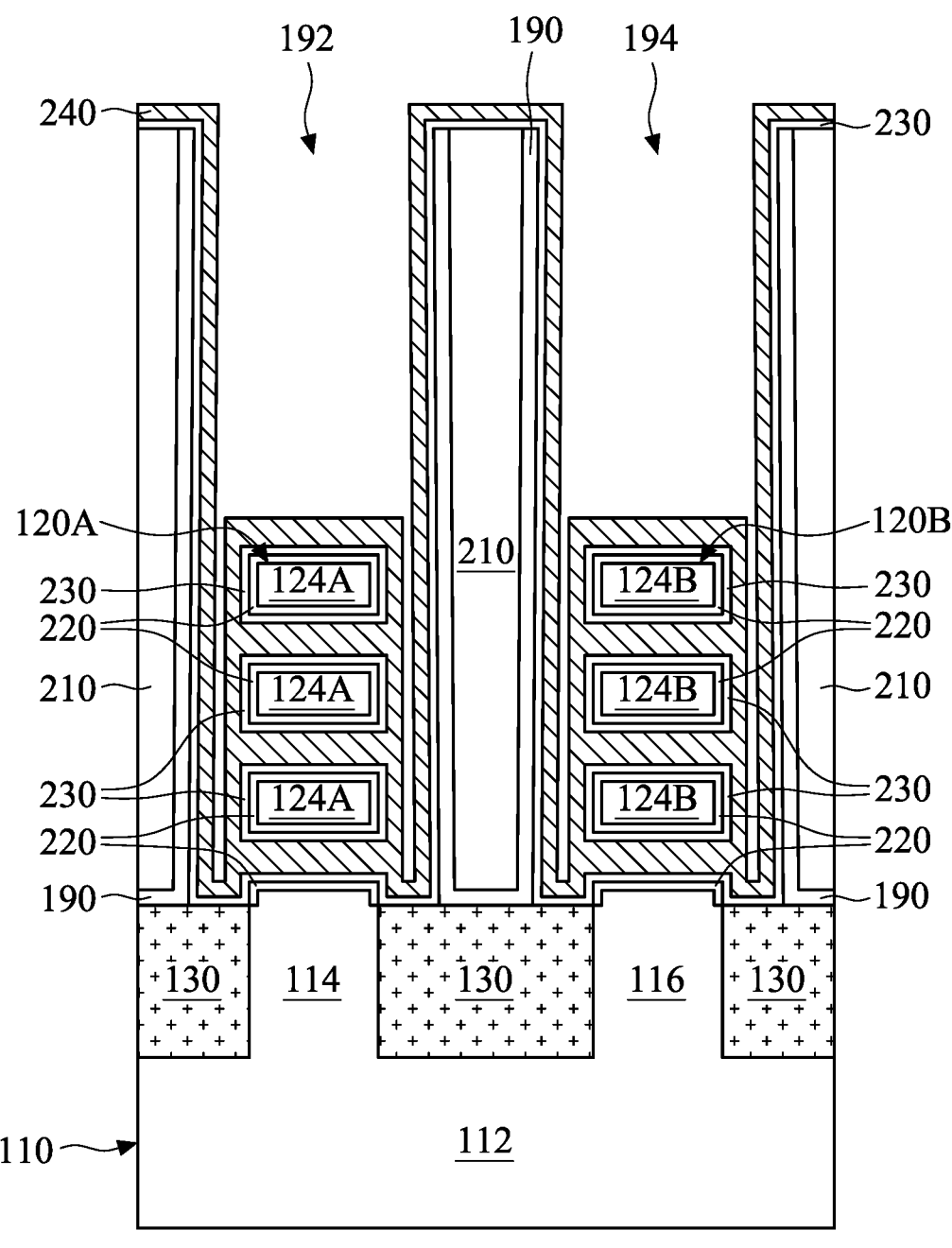

As shown in FIG. 1H, an interfacial layer 220 is conformally formed over the fins 114 and 116 and the nanostructures 124A and 124B, in accordance with some embodiments. The interfacial layer 220 is made of an insulating material such as oxide (e.g., silicon oxide), in accordance with some embodiments. The interfacial layer 220 is formed using an oxidation process, in accordance with some embodiments.

As shown in FIG. 1H, a gate dielectric layer 230 is conformally formed over the interfacial layer 220, the isolation layer 130, the protective layer 190, and the isolation structure 210, in accordance with some embodiments. The gate dielectric layer 230 is made of a high-K material, such as $HfO_2$, $La_2O_3$, $CaO$, $ZrO_2$, $HfZrO_2$, or $Al_2O_3$, in accordance with some embodiments. The gate dielectric layer 230 is formed using an atomic layer deposition process or another suitable process.

As shown in FIG. 1H, a work function metal layer 240 is conformally formed over the gate dielectric layer 230, in accordance with some embodiments. The work function metal layer 240 provides a desired work function for transistors to enhance device performance including improved threshold voltage. The work function metal layer 240 is also referred to as an n-type work function metal layer, in accordance with some embodiments. The work function metal layer 240 can be a metal capable of providing a work function value suitable for the device, such as equal to or less than about 4.5 eV.

The work function metal layer 240 is made of metal, metal carbide, metal nitride, or a combination thereof, in accordance with some embodiments. For example, the work function metal layer 240 is made of tantalum, hafnium carbide, zirconium carbide, tantalum nitride, or a combination thereof.

The work function metal layer 240 is formed using a deposition process, in accordance with some embodiments. The deposition process includes a physical vapor deposition process, a chemical vapor deposition process, an atomic layer deposition process, or a combination thereof, in accordance with some embodiments.

Figure 1I:
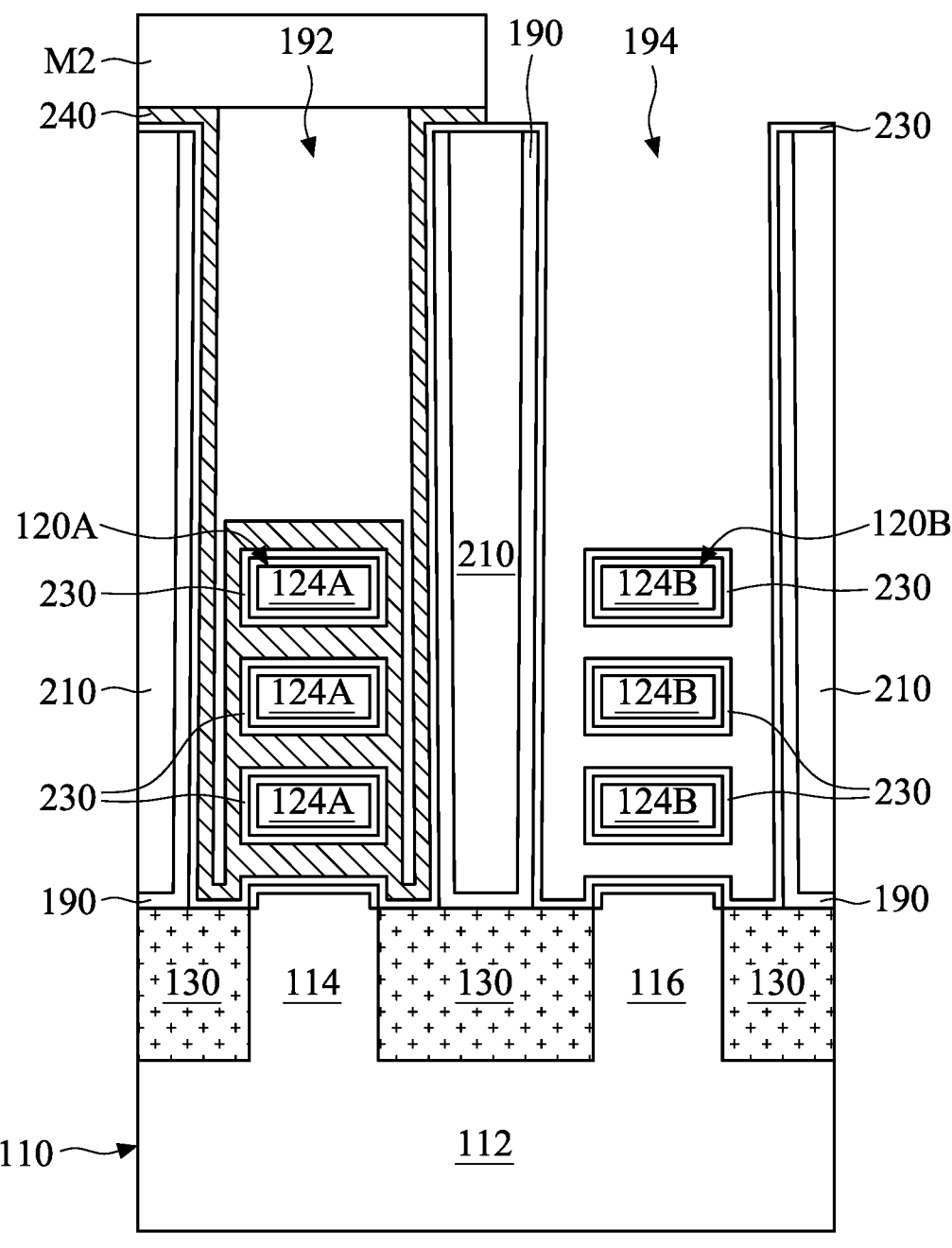

As shown in FIG. 1I, a mask layer M2 is formed over the work function metal layer 240, in accordance with some embodiments. In some other embodiments, as shown in FIG. 3, the mask layer M2 is partially in the recess 192 of the protective layer 190. As shown in FIG. 1I, portions of the work function metal layer 240, which are not covered by the mask layer M2, are removed, in accordance with some embodiments. The removal process includes an etching process such as a dry etching process, in accordance with some embodiments.

Figure 1J:
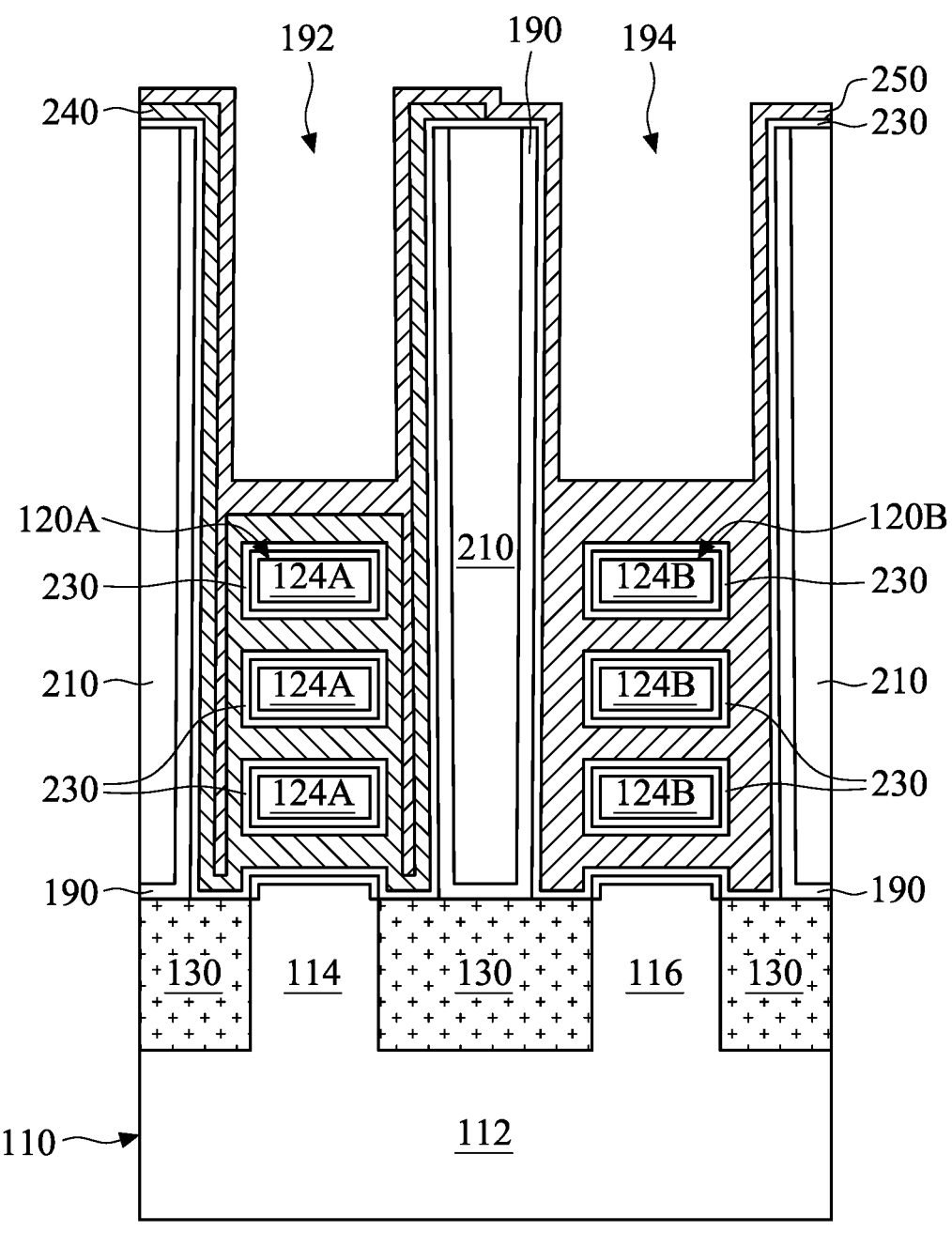

As shown in FIG. 1J, a work function metal layer 250 is conformally formed over the gate dielectric layer 230 in the recess 194 of the protective layer 190, in accordance with some embodiments. The work function metal layer 250 is further formed over the work function metal layer 240, in accordance with some embodiments.

The work function metal layer 250 is also referred to as a p-type work function metal layer, in accordance with some embodiments. The work function metal layer 250 provides a desired work function for transistors to enhance device performance including improved threshold voltage. The work function metal layer 250 can be a metal capable of providing a work function value suitable for the device, such as equal to or greater than about 4.8 eV.

The work function metal layer 250 is made of metal, metal carbide, metal nitride, another suitable material, or a combination thereof, in accordance with some embodiments. For example, the work function metal layer 250 is made of titanium, titanium nitride, another suitable material, or a combination thereof.

The work function metal layer 250 is formed using a deposition process, in accordance with some embodiments. The deposition process includes a physical vapor deposition process, a chemical vapor deposition process, an atomic layer deposition process, or a combination thereof, in accordance with some embodiments.

Figures 1K, 1L:
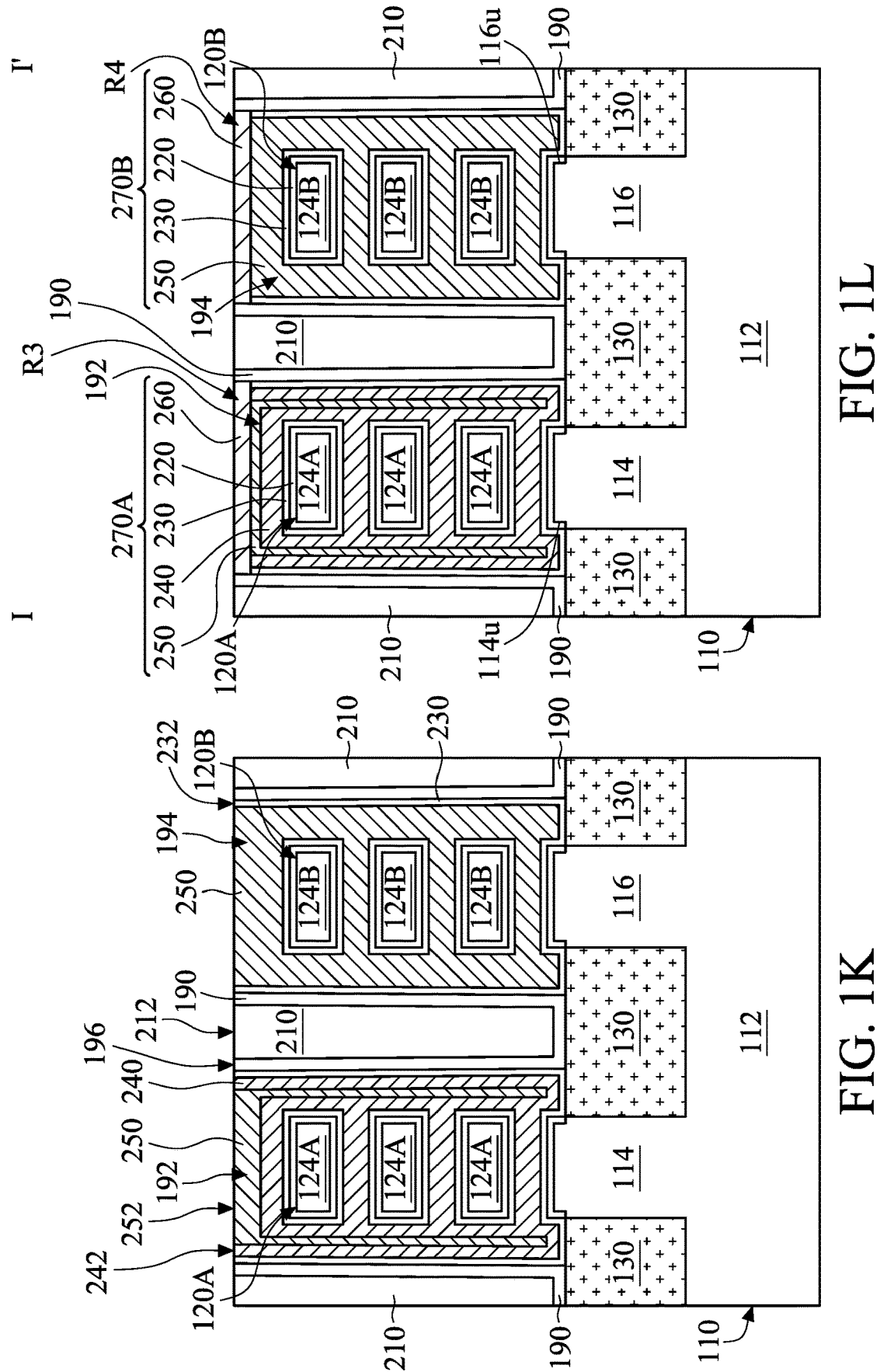
Figures 1, 1L:
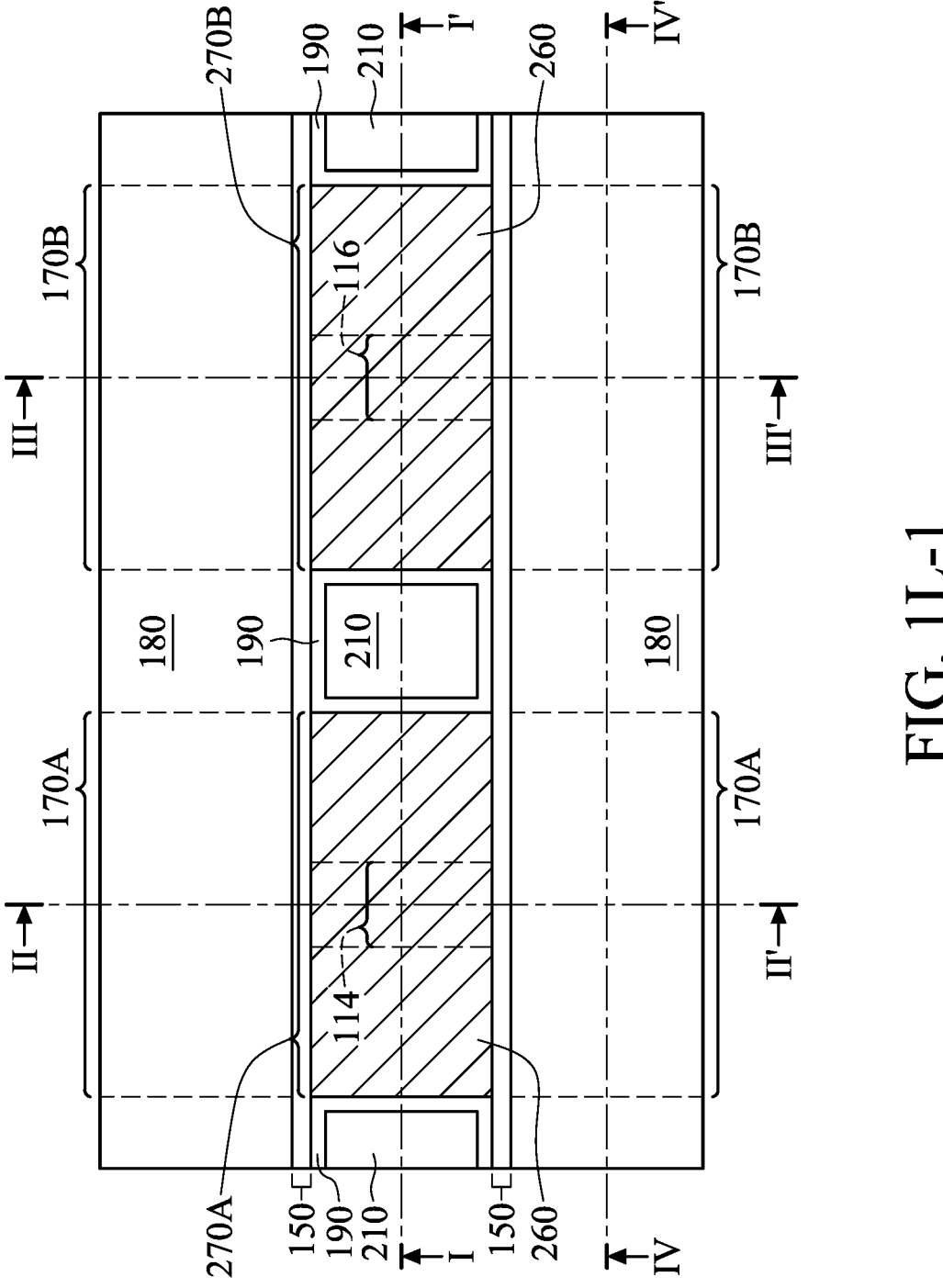
Figures 1, 1L, 2, 3:
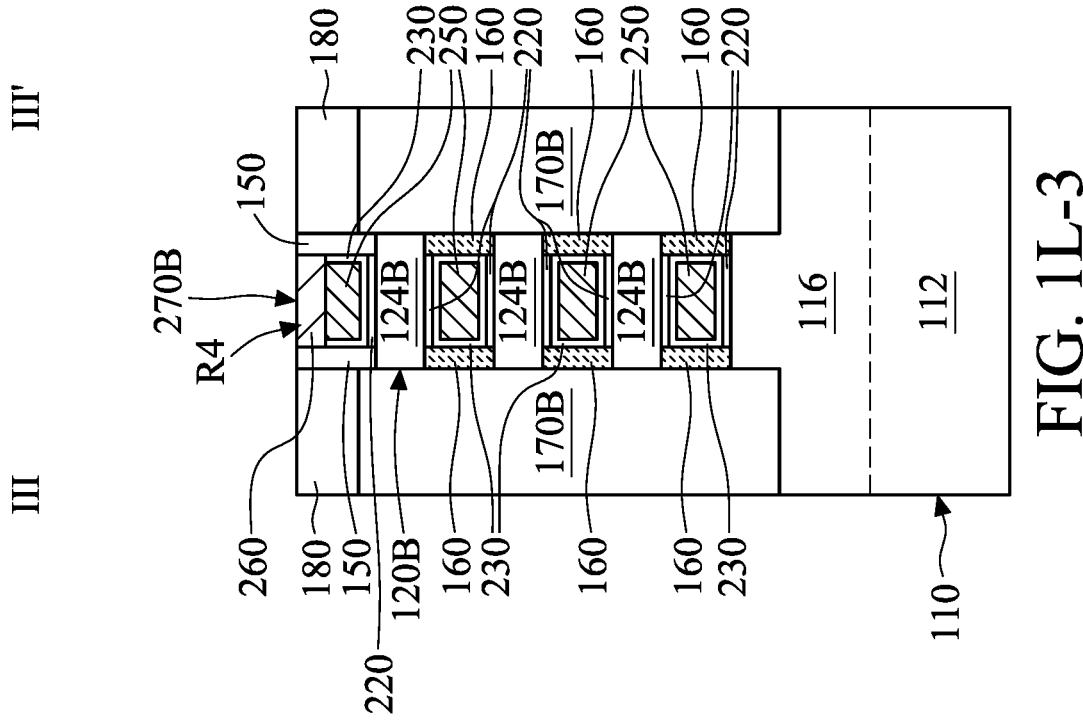
Figures 1, 1L, 2:
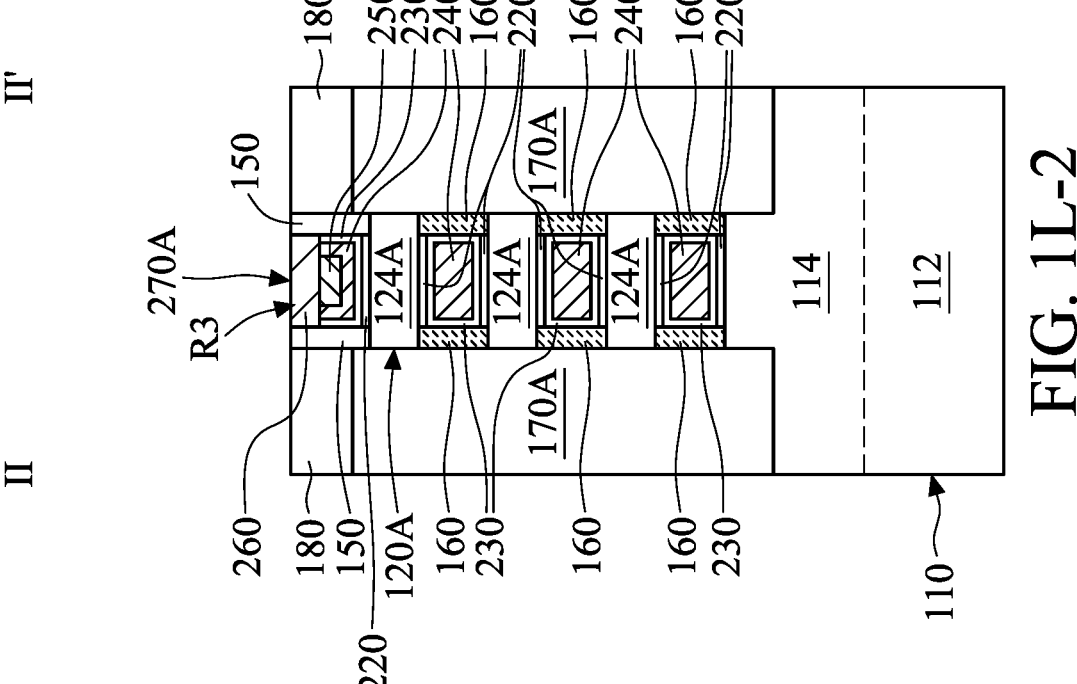

As shown in FIG. 1K, top portions of the protective layer 190, the isolation structure 210, the gate dielectric layer 230, and the work function metal layers 240 and 250, which are outside of the recesses 192 and 194 of the protective layer 190, are removed, in accordance with some embodiments. The removal process includes a planarization process such as a chemical mechanical polishing (CMP) process, in accordance with some embodiments.

After the removal process, top surfaces 196, 212, 232, 242, and 252 of the protective layer 190, the isolation structure 210, the gate dielectric layer 230, and the work function metal layers 240 and 250 are substantially level with each other, in accordance with some embodiments.

FIG. 1L-1 is a top view of the semiconductor device structure of FIG. 1L, in accordance with some embodiments. FIG. 1L-2 is a cross-sectional view illustrating the semiconductor device structure along a sectional line II-II' in FIG. 1L-1, in accordance with some embodiments. FIG. 1L-3 is a cross-sectional view illustrating the semiconductor device structure along a sectional line III-III' in FIG. 1L-1, in accordance with some embodiments. FIG. 2A is a cross-sectional view illustrating the semiconductor device structure along a sectional line IV-IV' in FIG. 1L-1, in accordance with some embodiments.

As shown in FIG. 1L, top portions of the gate dielectric layer 230 and the work function metal layers 240 and 250 are removed to form recesses R3 and R4 over the nanostructure stacks 120A and 120B, in accordance with some embodiments. The removal process includes an etching process, such as a dry etching process or a wet etching process, in accordance with some embodiments.

As shown in FIGS. 1L, 1L-1, 1L-2, 1L-3, and 2A, a gate electrode layer 260 is formed in the recesses R3 and R4, in accordance with some embodiments. The gate electrode layer 260 is made of W, Co, Al, or another suitable conductive material. The gate electrode layer 260 is formed using an atomic layer deposition process or another suitable process.

The gate electrode layer 260 in the recess R3, the interfacial layer 220, the gate dielectric layer 230, and the work function metal layers 240 and 250 in the recess 192 of the protective layer 190 together form a gate stack 270A, in accordance with some embodiments.

The gate electrode layer 260 in the recess R4, the interfacial layer 220, the gate dielectric layer 230, and the work function metal layer 250 in the recess 194 of the protective layer 190 together form a gate stack 270B, in accordance with some embodiments.

The isolation structure 210 is between the gate stack 270A and the gate stack 270B, in accordance with some embodiments. The isolation structure 210 separates the gate stack 270A from the gate stack 270B, in accordance with some embodiments. The gate stack 270A is wrapped around the nanostructures 124A and the upper portion 114u of the fin 114, in accordance with some embodiments. The gate stack 270B is wrapped around the nanostructures 124B and the upper portion 116u of the fin 116, in accordance with some embodiments.

Figure 2B:
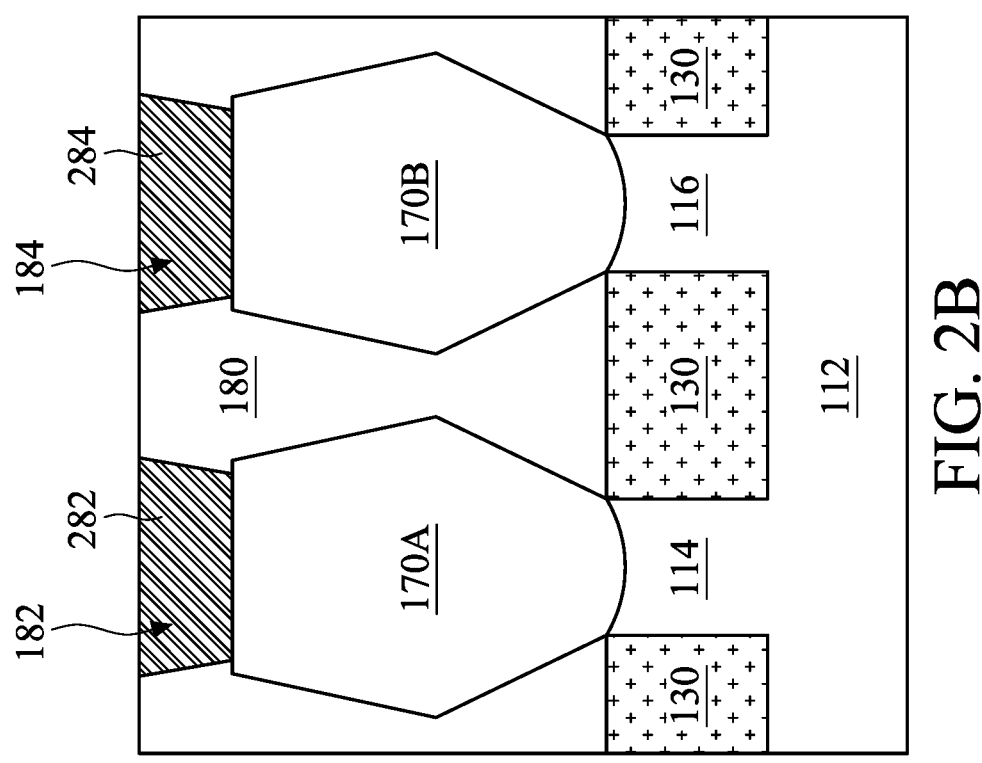
FIGS. 2A-2L are cross-sectional views of various stages of a process for forming a semiconductor device structure, in accordance with some embodiments.
Figure 2A:
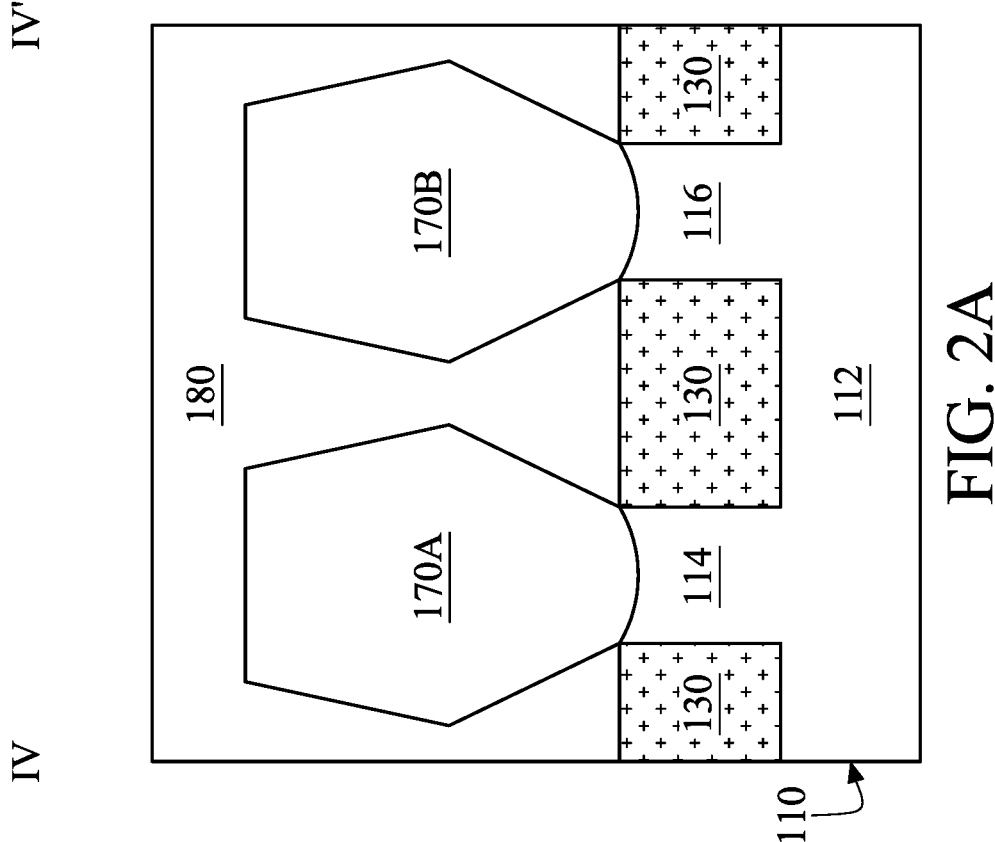

FIGS. 2A-2L are cross-sectional views of various stages of a process for forming a semiconductor device structure, in accordance with some embodiments. After the step illustrated in FIG. 2A, as shown in FIG. 2B, portions of the dielectric layer 180 are removed to form recesses 182 and 184 in the dielectric layer 180, in accordance with some embodiments. The recesses 182 and 184 expose the source/drain structures 170A and 170B respectively, in accordance with some embodiments. The removal process includes an etching process such as a dry etching process, in accordance with some embodiments.

As shown in FIG. 2B, conductive structures 282 and 284 are formed in the recesses 182 and 184 respectively, in accordance with some embodiments. The conductive structures 282 and 284 are made of W, Co, Al, Cu, or another suitable conductive material. The formation of the conductive structures 282 and 284 includes a deposition process and a planarization process, in accordance with some embodiments.

Figure 2D:
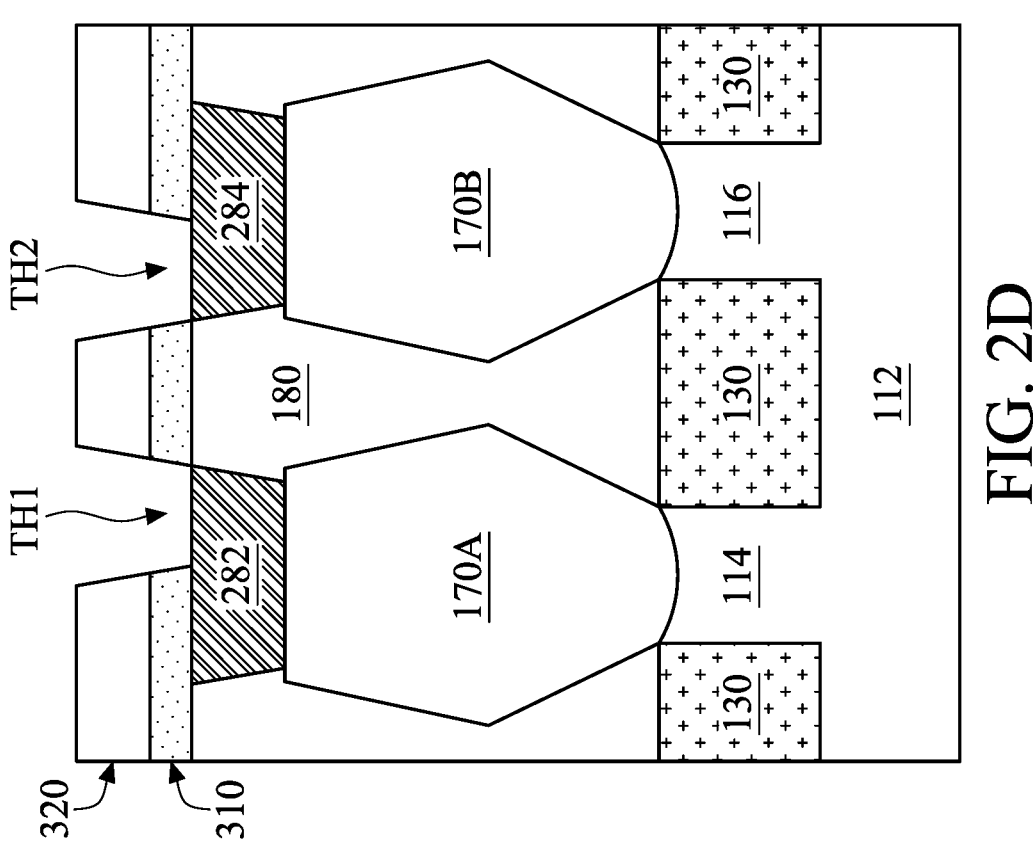
Figure 2C:
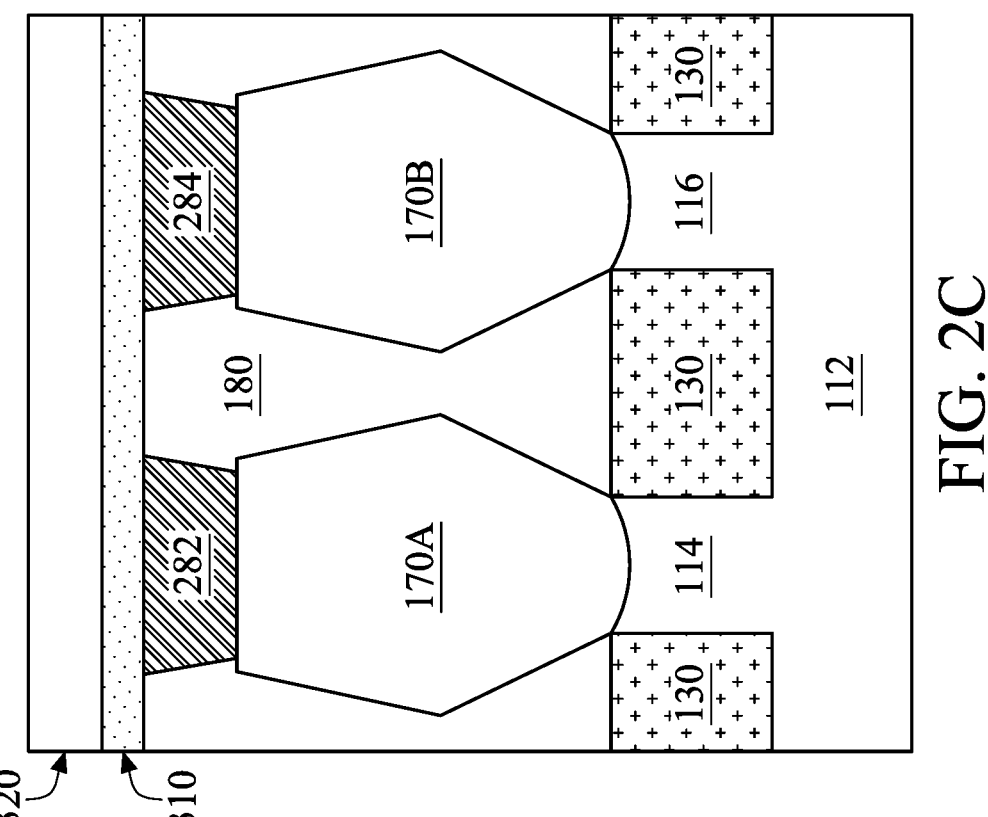

As shown in FIGS. 1L-1 and 2C, an etch stop layer 310 is formed over the conductive structures 282 and 284, the protective layer 190, the isolation structure 210, the gate stack 270A, the gate stack 270B, the spacer layer 150, and the dielectric layer 180, in accordance with some embodiments. The etching stop layer 310 is made of a nitride material such as silicon nitride, in accordance with some embodiments.

The etching stop layer 310 is formed using a deposition process such as a chemical vapor deposition (CVD) process, an atomic layer deposition (ALD) process, or a physical vapor deposition (PVD) process, in accordance with some embodiments.

As shown in FIG. 2C, a dielectric layer 320 is formed over the etch stop layer 310, in accordance with some embodiments. The dielectric layer 320 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

The dielectric layer 320 is formed using a deposition process, in accordance with some embodiments. The deposition process includes an atomic layer deposition (ALD) process, a chemical vapor deposition (CVD) process, or another applicable process.

As shown in FIG. 2D, the dielectric layer 320 and the etch stop layer 310 are partially removed to form through holes TH1 and TH2 in the dielectric layer 320 and the etch stop layer 310, in accordance with some embodiments. The through holes TH1 and TH2 expose portions of the conductive structures 282 and 284 respectively, in accordance with some embodiments. The removal process includes an etching process such as a dry etching process, in accordance with some embodiments.

Figures 2E, 2F:
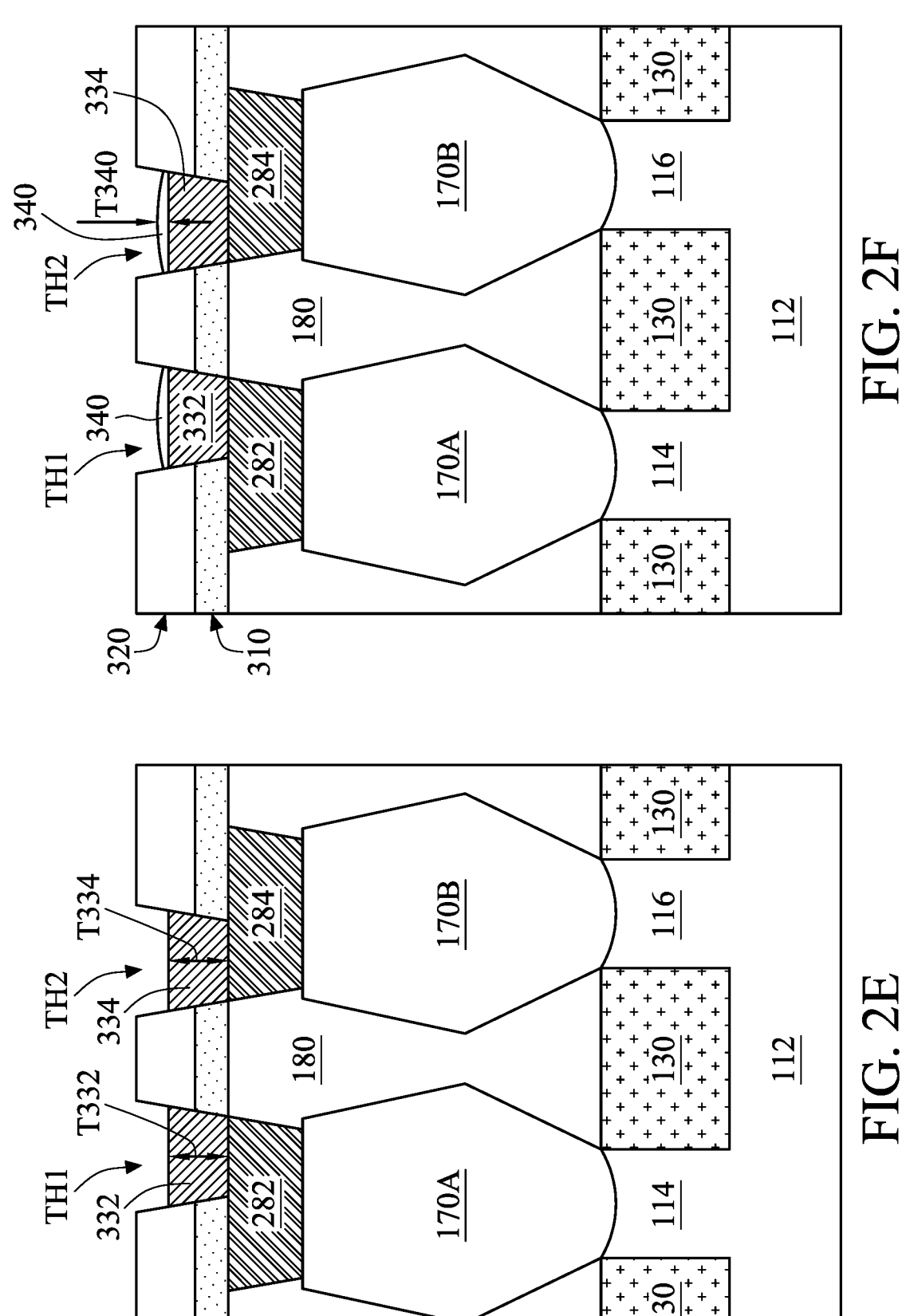

As shown in FIG. 2E, a selective deposition process is performed over the conductive structures 282 and 284 to form conductive via portions 332 and 334 in the through holes TH1 and TH2 respectively, in accordance with some embodiments. The conductive via portion 332 is electrically connected to the conductive structure 282 thereunder, in accordance with some embodiments. The conductive via portion 334 is electrically connected to the conductive structure 284 thereunder, in accordance with some embodiments.

The thickness T332 of the conductive via portion 332 ranges from about 1 nm to about 50 nm, in accordance with some embodiments. The thickness T332 of the conductive via portion 332 ranges from about 1 nm to about 20 nm, in accordance with some embodiments.

The thickness T334 of the conductive via portion 334 ranges from about 1 nm to about 50 nm, in accordance with some embodiments. The thickness T334 of the conductive via portion 334 ranges from about 1 nm to about 20 nm, in accordance with some embodiments.

The conductive via portions 332 and 334 are made of a conductive material such as W, Co, another suitable metal material, or an alloy thereof, in accordance with some embodiments. The selective deposition process includes an atomic layer deposition (ALD) process, in accordance with some embodiments.

As shown in FIG. 2F, a sacrificial layer 340 is formed over the conductive via portions 332 and 334, in accordance with some embodiments. The thickness T340 of the sacrificial layer 340 ranges from about 4 Å to about 10 Å, in accordance with some embodiments.

The sacrificial layer 340 is made of a polymer material such as a bottom anti-reflective coating (BARC) material, in accordance with some embodiments. The BARC material includes carbon, oxygen, and nitrogen, in accordance with some embodiments. The sacrificial layer 340 is formed using a selective deposition process, in accordance with some embodiments. The selective deposition process includes an atomic layer deposition (ALD) process, in accordance with some embodiments.

Figures 2G, 2H:
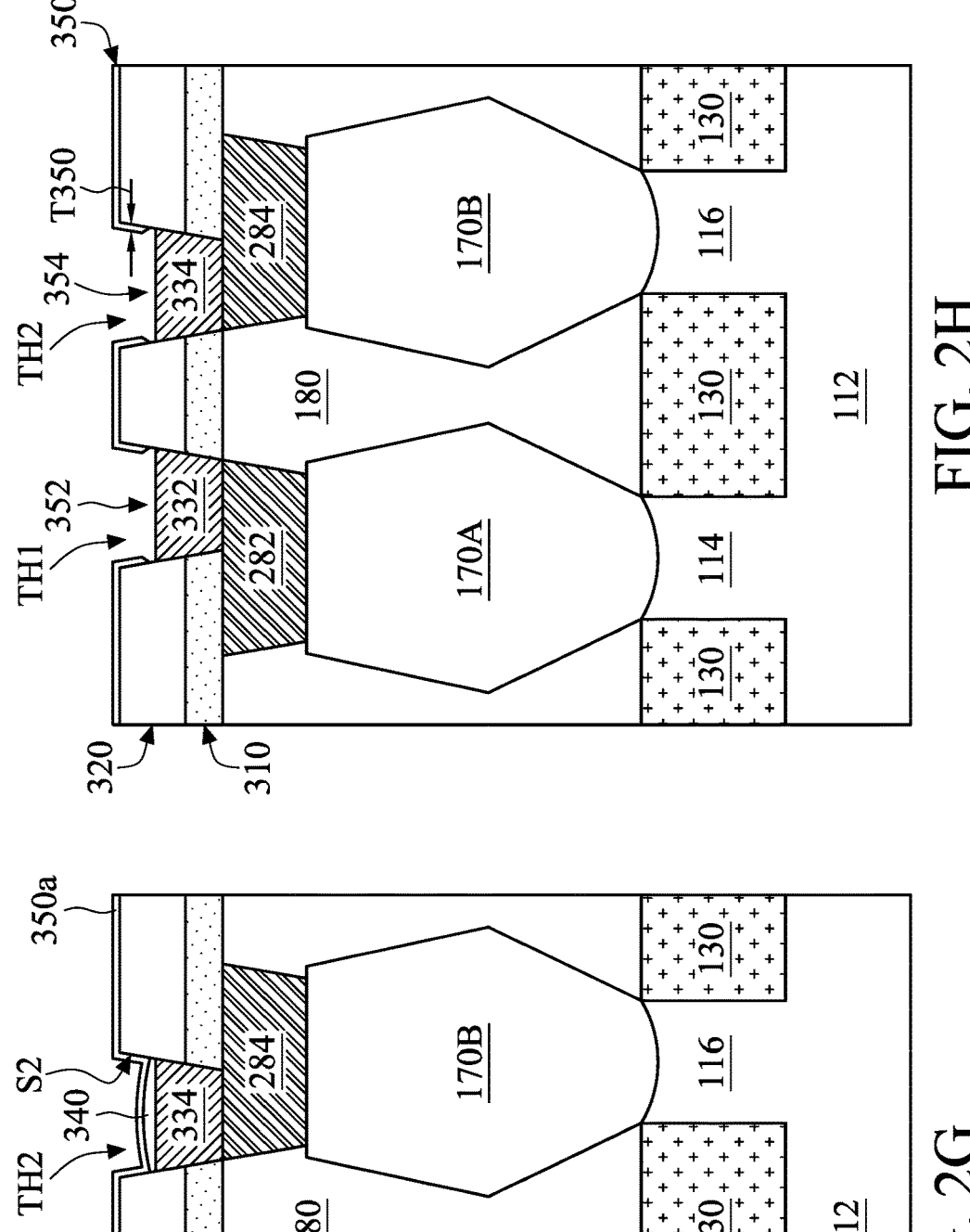

As shown in FIG. 2G, a barrier material layer 350a is conformally deposited over the dielectric layer 320 and in the through holes TH1 and TH2 to cover the inner walls S1 and S2 of the through holes TH1 and TH2 and the sacrificial layer 340, in accordance with some embodiments.

The barrier material layer 350a is made of metal nitrides such as TaN or TiN, in accordance with some embodiments. The barrier material layer 350a is formed using a deposition process such as a chemical vapor deposition (CVD) process, an atomic layer deposition (ALD) process, or a physical vapor deposition (PVD) process, in accordance with some embodiments.

As shown in FIGS. 2G and 2H, the sacrificial layer 340 and portions of the barrier material layer 350a over the sacrificial layer 340 are removed to form openings 352 and 354 in the barrier material layer 350a, in accordance with some embodiments. The openings 352 and 354 expose the conductive via portions 332 and 334 thereunder respectively, in accordance with some embodiments.

The barrier material layer 350a with the openings 352 and 354 forms a barrier layer 350, in accordance with some embodiments. The thickness T350 of the barrier layer 350 ranges from about 5 Å to about 15 Å, in accordance with some embodiments. The removal process includes an etching process such as a dry etching process (e.g. a plasma etching process), in accordance with some embodiments. The plasma etching process uses Ar gas as the process gas, in accordance with some embodiments.

Figures 2I, 2J:
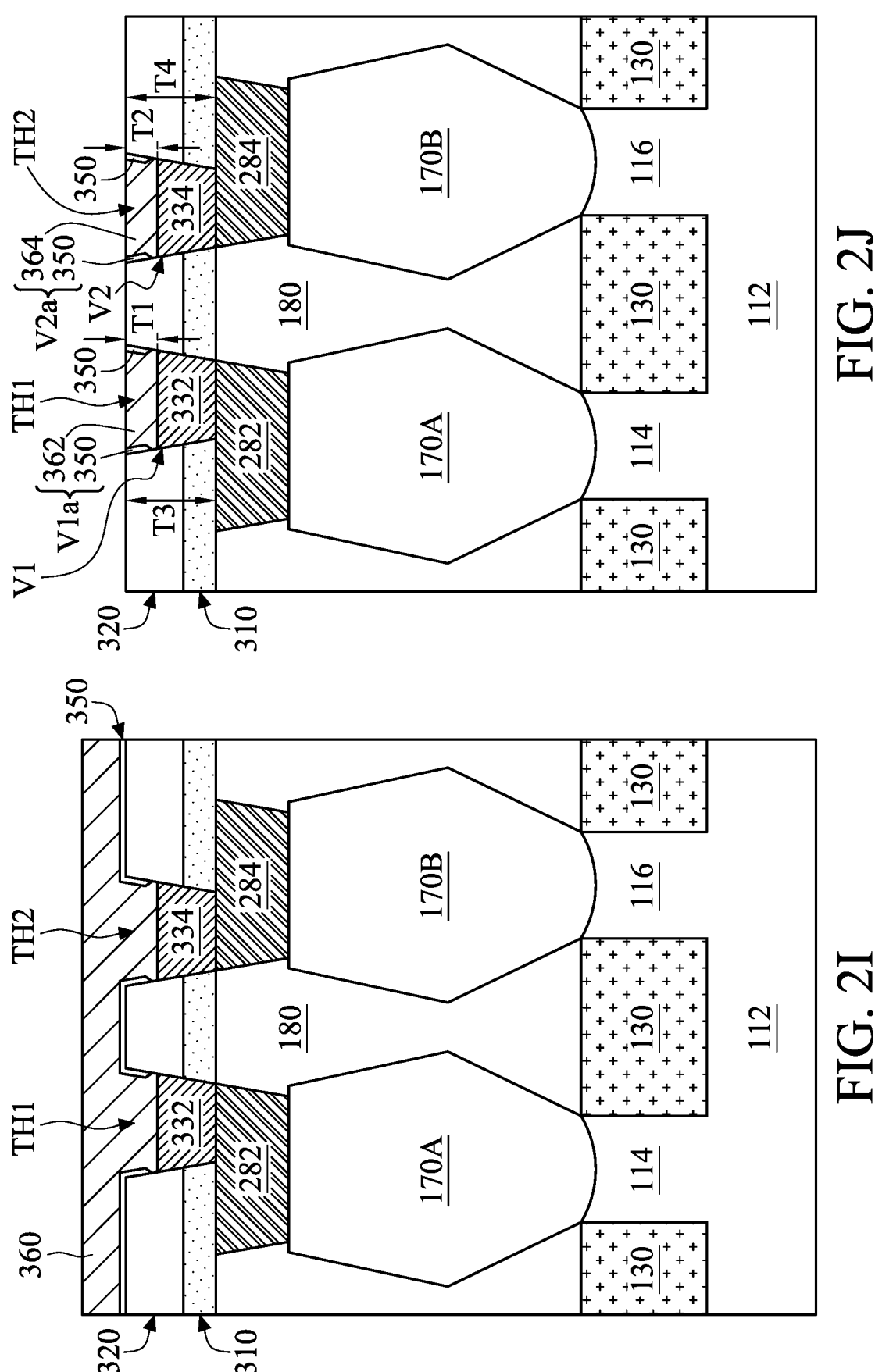

As shown in FIG. 2I, a conductive material layer 360 is formed over the barrier layer 350 and in the through holes TH1 and TH2, in accordance with some embodiments. The conductive material layer 360 is made of a conductive material with an ultra-low resistance such as W, Co, Al, Pt, Ag, Ru, Cu, RuCo, Ru-alloy, Cu-alloy, another suitable metal material, or another suitable alloy material, in accordance with some embodiments.

The conductive material layer 360 is formed using a deposition process such as a chemical vapor deposition (CVD) process, an atomic layer deposition (ALD) process, or a physical vapor deposition (PVD) process, in accordance with some embodiments.

As shown in FIG. 2J, portions of the conductive material layer 360 and the barrier layer 350 outside of the through holes TH1 and TH2 are removed, in accordance with some embodiments. The conductive material layer 360 remaining in the through hole TH1 forms a conductive layer 362, in accordance with some embodiments.

The conductive layer 362 is over the conductive via portion 332, in accordance with some embodiments. The barrier layer 350 in the through hole TH1 continuously surrounds the conductive layer 362, in accordance with some embodiments. The barrier layer 350 is between the conductive layer 362 and the dielectric layer 320, in accordance with some embodiments. The barrier layer 350 in the through hole TH1 and the conductive layer 362 together form a conductive via portion V1a, in accordance with some embodiments.

The thickness T1 of the conductive via portion V1a ranges from about 1 nm to about 50 nm, in accordance with some embodiments. The thickness T1 of the conductive via portion V1a ranges from about 2 nm to about 10 nm, in accordance with some embodiments.

The conductive via portions 332 and V1a together form a conductive via structure V1, in accordance with some embodiments. The conductive via structure V1 passes through the dielectric layer 320 and the etch stop layer 310, in accordance with some embodiments. The thickness T3 of the conductive via structure V1 ranges from about 10 nm to about 22 nm, in accordance with some embodiments.

The conductive material layer 360 remaining in the through hole TH2 forms a conductive layer 364, in accordance with some embodiments. The conductive layer 364 is over the conductive via portion 334, in accordance with some embodiments. The barrier layer 350 in the through hole TH2 continuously surrounds the conductive layer 364, in accordance with some embodiments. The barrier layer 350 is between the conductive layer 364 and the dielectric layer 320, in accordance with some embodiments.

The barrier layer 350 in the through hole TH2 and the conductive layer 364 together form a conductive via portion V2a, in accordance with some embodiments. The thickness T2 of the conductive via portion V2a ranges from about 1 nm to about 50 nm, in accordance with some embodiments. The thickness T2 of the conductive via portion V2a ranges from about 2 nm to about 10 nm, in accordance with some embodiments.

The conductive via portions 334 and V2a together form a conductive via structure V2, in accordance with some embodiments. The conductive via structure V2 passes through the dielectric layer 320 and the etch stop layer 310, in accordance with some embodiments.

The thickness T4 of the conductive via structure V2 ranges from about 10 nm to about 22 nm, in accordance with some embodiments. The removal process includes a planarization process such as a chemical mechanical polishing (CMP) process, in accordance with some embodiments.

Figures 2K, 2L:
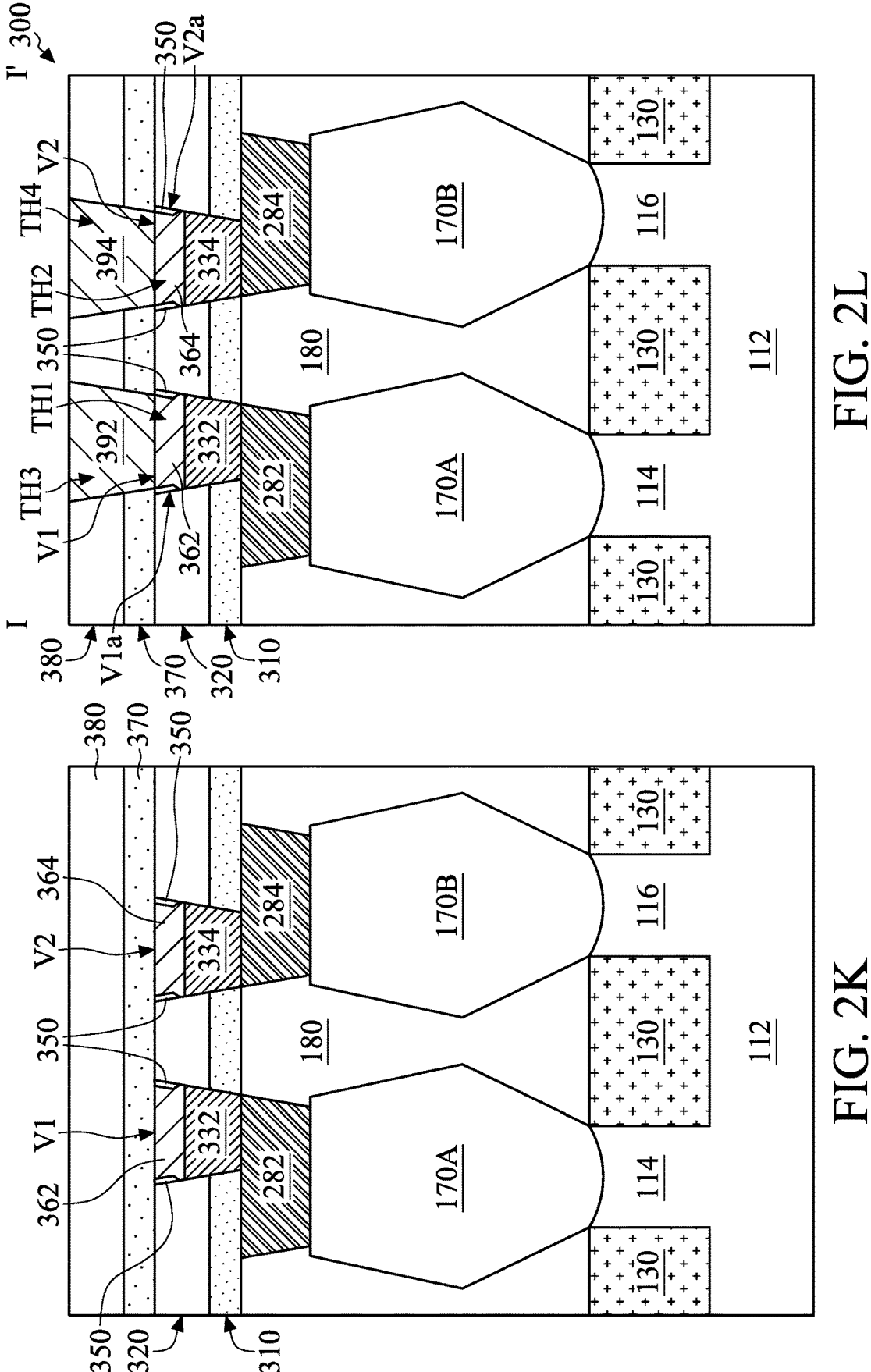

As shown in FIG. 2K, an etch stop layer 370 is formed over the conductive via structures V1 and V2 and the dielectric layer 320, in accordance with some embodiments. The etching stop layer 370 is made of a nitride material such as silicon nitride, in accordance with some embodiments. The etching stop layer 370 is formed using a deposition process such as a chemical vapor deposition (CVD) process, an atomic layer deposition (ALD) process, or a physical vapor deposition (PVD) process, in accordance with some embodiments.

As shown in FIG. 2K, a dielectric layer 380 is formed over the etch stop layer 370, in accordance with some embodiments. The dielectric layer 380 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

The dielectric layer 380 is formed using a deposition process, in accordance with some embodiments. The deposition process includes an atomic layer deposition (ALD) process, a chemical vapor deposition (CVD) process, or another applicable process.

As shown in FIG. 2L, portions of the dielectric layer 380 and the etch stop layer 370 are removed to form through holes TH3 and TH4, in accordance with some embodiments. The through hole TH3 exposes the conductive via structure V1, in accordance with some embodiments. The through hole TH4 exposes the conductive via structure V2, in accordance with some embodiments. The removal process includes an etching process such as a dry etching process, in accordance with some embodiments.

As shown in FIG. 2L, conductive lines 392 and 394 are formed in the through holes TH3 and TH4 respectively, in accordance with some embodiments. The conductive lines 392 and 394 pass through the dielectric layer 380 and the etch stop layer 370, in accordance with some embodiments. The conductive line 392 is over and connected to the conductive via structure V1, in accordance with some embodiments.

The conductive line 394 is over and connected to the conductive via structure V2, in accordance with some embodiments. The conductive lines 392 and 394 are made of a conductive material such as Ru, Cu, W, Co, Al, Pt, Ag, RuCo, or an alloy thereof, in accordance with some embodiments.

Since the barrier layer 350 in the through hole TH1 continuously surrounds the conductive layer 362, the overall diffusion rate of the conductive via portion V1a in the dielectric layer 320 is lower than the overall diffusion rate of the conductive via portion 332 in the dielectric layer 320, in accordance with some embodiments. Therefore, the formation of the barrier layer 350 in the through hole TH1 is able to prevent leakage or shorts between the conductive layer 362 and the conductive line 394, in accordance with some embodiments.

Similarly, since the barrier layer 350 in the through hole TH2 continuously surrounds the conductive layer 364, the overall diffusion rate of the conductive via portion V2a in the dielectric layer 320 is lower than the overall diffusion rate of the conductive via portion 334 in the dielectric layer 320, in accordance with some embodiments. Therefore, the formation of the barrier layer 350 in the through hole TH2 is able to prevent leakage or shorts between the conductive layer 364 and the conductive line 392, in accordance with some embodiments. In this step, a semiconductor device structure 300 is substantially formed, in accordance with some embodiments.

Figure 3A:
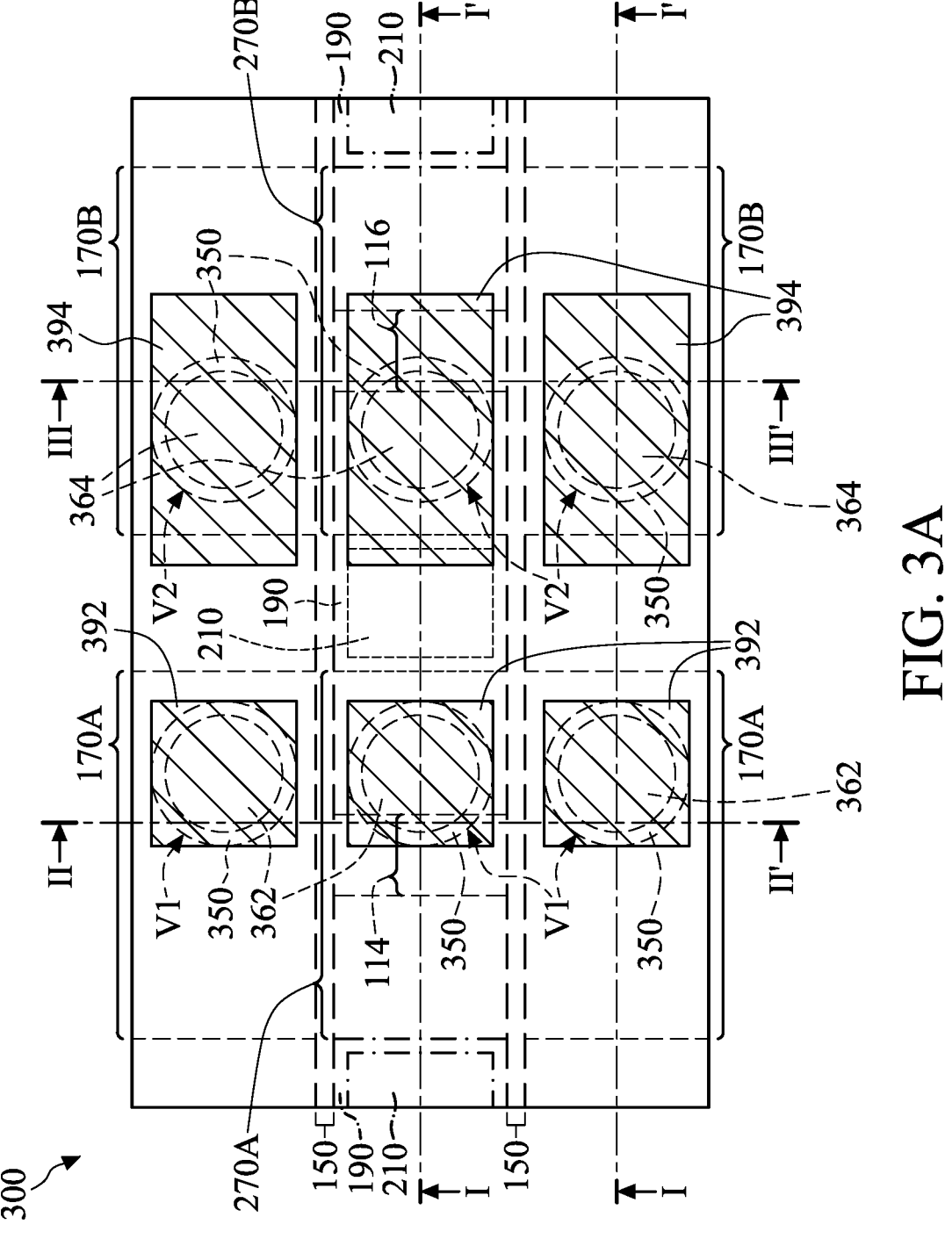
FIG. 3A is a top view of the semiconductor device structure of FIG. 2L, in accordance with some embodiments.
Figure 3C:
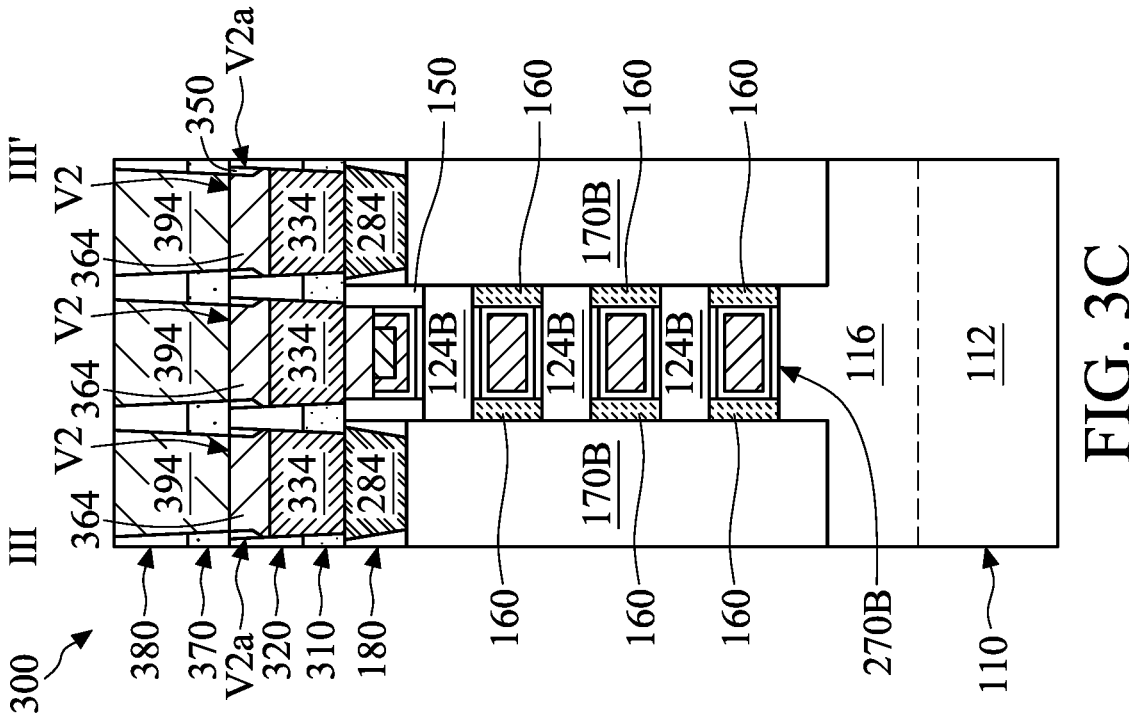
FIG. 3C is a cross-sectional view illustrating the semiconductor device structure along a sectional line III-III' in FIG. 3A, in accordance with some embodiments.
Figure 3B:
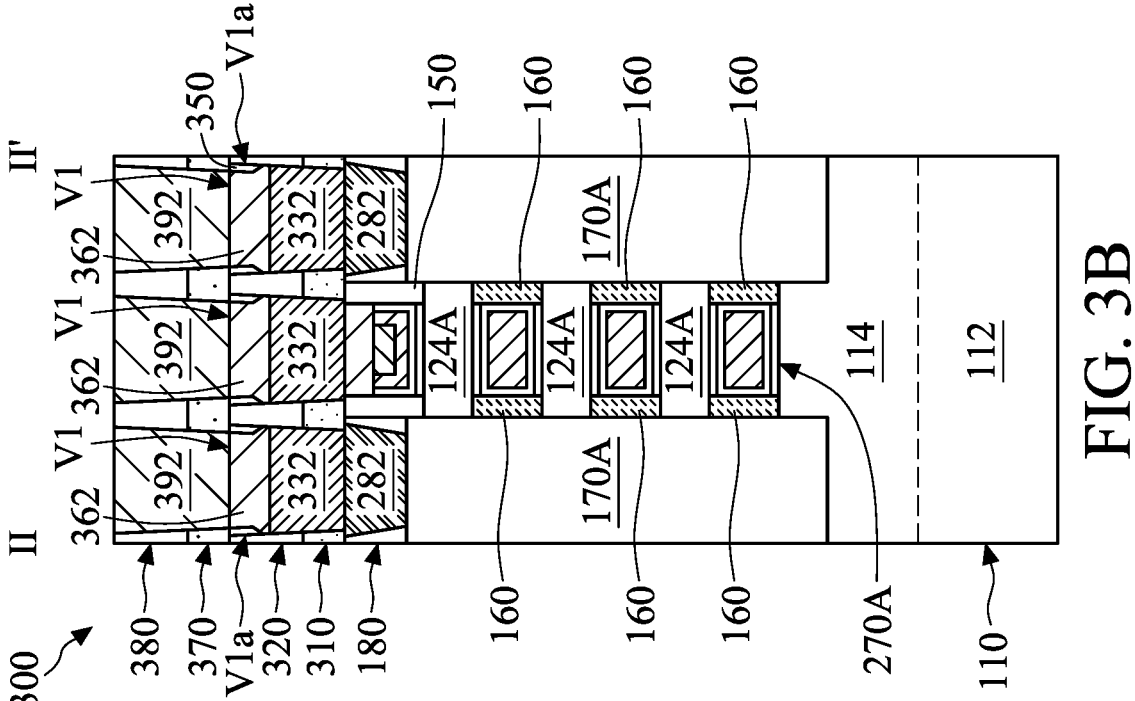
FIG. 3B is a cross-sectional view illustrating the semiconductor device structure along a sectional line II-II' in FIG. 3A, in accordance with some embodiments.

FIG. 3A is a top view of the semiconductor device structure of FIG. 2L, in accordance with some embodiments. FIG. 3B is a cross-sectional view illustrating the semiconductor device structure along a sectional line II-II' in FIG.

3A, in accordance with some embodiments. FIG. 3C is a cross-sectional view illustrating the semiconductor device structure along a sectional line III-III' in FIG. 3A, in accordance with some embodiments.

As shown in FIGS. 2L, 3A, and 3B, the conductive via structure V1 and the conductive line 392 are further formed over and connected to the gate stack 270A, in accordance with some embodiments. As shown in FIGS. 2L, 3A, and 3C, the conductive via structure V2 and the conductive line 394 are further formed over and connected to the gate stack 270B, in accordance with some embodiments.

FIG. 4 is a cross-sectional view of a semiconductor device structure 400, in accordance with some embodiments. As shown in FIG. 4, the semiconductor device structure 400 is similar to the semiconductor device structure 300 of FIG. 2L, except that the semiconductor device structure 400 has a conductive via structure V3 to functionally replace the conductive via structure V2 of the semiconductor device structure 300 of FIG. 2L, in accordance with some embodiments.

The conductive via structure V3 is made of a conductive material such as W, Co, another suitable metal material, or an alloy thereof, in accordance with some embodiments. The formation of the conductive via structure V3 includes forming the through hole TH2 in the dielectric layer 320 and the etch stop layer 310 after the formation of the conductive via structure V1; depositing a conductive material layer into the through hole TH2; and removing the conductive material layer outside of the through hole TH2, in accordance with some embodiments.

Figures 4, 5:
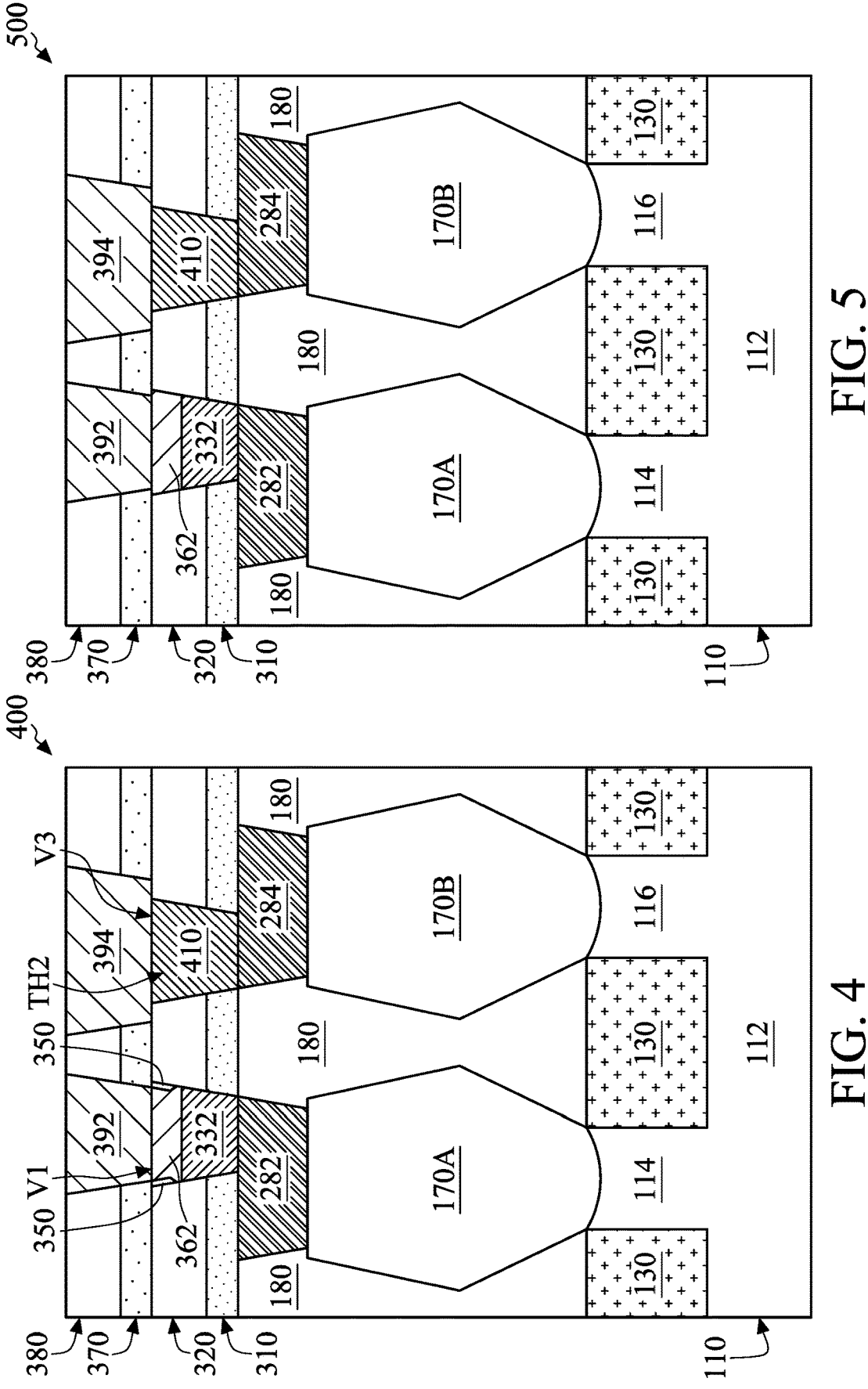

FIG. 5 is a cross-sectional view of a semiconductor device structure 500, in accordance with some embodiments. As shown in FIG. 5, the semiconductor device structure 500 is similar to the semiconductor device structure 400 of FIG. 4, except that the semiconductor device structure 500 does not have the barrier layer 350 of the semiconductor device structure 400 of FIG. 4, in accordance with some embodiments.

The conductive layer 362 is made of a conductive material which has a diffusion rate lower than the diffusion rate of the conductive via portion 332 in the dielectric layer 320, in accordance with some embodiments. Therefore, leakage and shorts between the conductive layer 362 and the conductive line 394 are prevented, in accordance with some embodiments. In some embodiments, the overall diffusion rate of the conductive layer 362 in the dielectric layer 320 is lower than the overall diffusion rate of the conductive via portion 332 in the dielectric layer 320.

The conductive material includes molybdenum or another suitable material, in accordance with some embodiments. The resistance of the conductive via portion 332 is lower than the resistance of the conductive layer 362, in accordance with some embodiments. The conductive layer 362 is formed using a selective deposition process, in accordance with some embodiments. The selective deposition process includes an atomic layer deposition (ALD) process, in accordance with some embodiments.

In some other embodiments, the overall diffusion rate of the conductive via portion 332 in the dielectric layer 320 is lower than the overall diffusion rate of the conductive layer 362 in the dielectric layer 320. Therefore, leakage and shorts between the conductive via portion 332 and the conductive structure 284 are prevented, in accordance with some embodiments. The conductive via portion 332 and the conductive layer 362 are made of different materials, in accordance with some embodiments. The conductive via portion 332 is made of molybdenum or another suitable material, and the conductive layer 362 is made of a conductive material such as W, Co, another suitable metal material, or an alloy thereof.

Figures 6A, 6B:
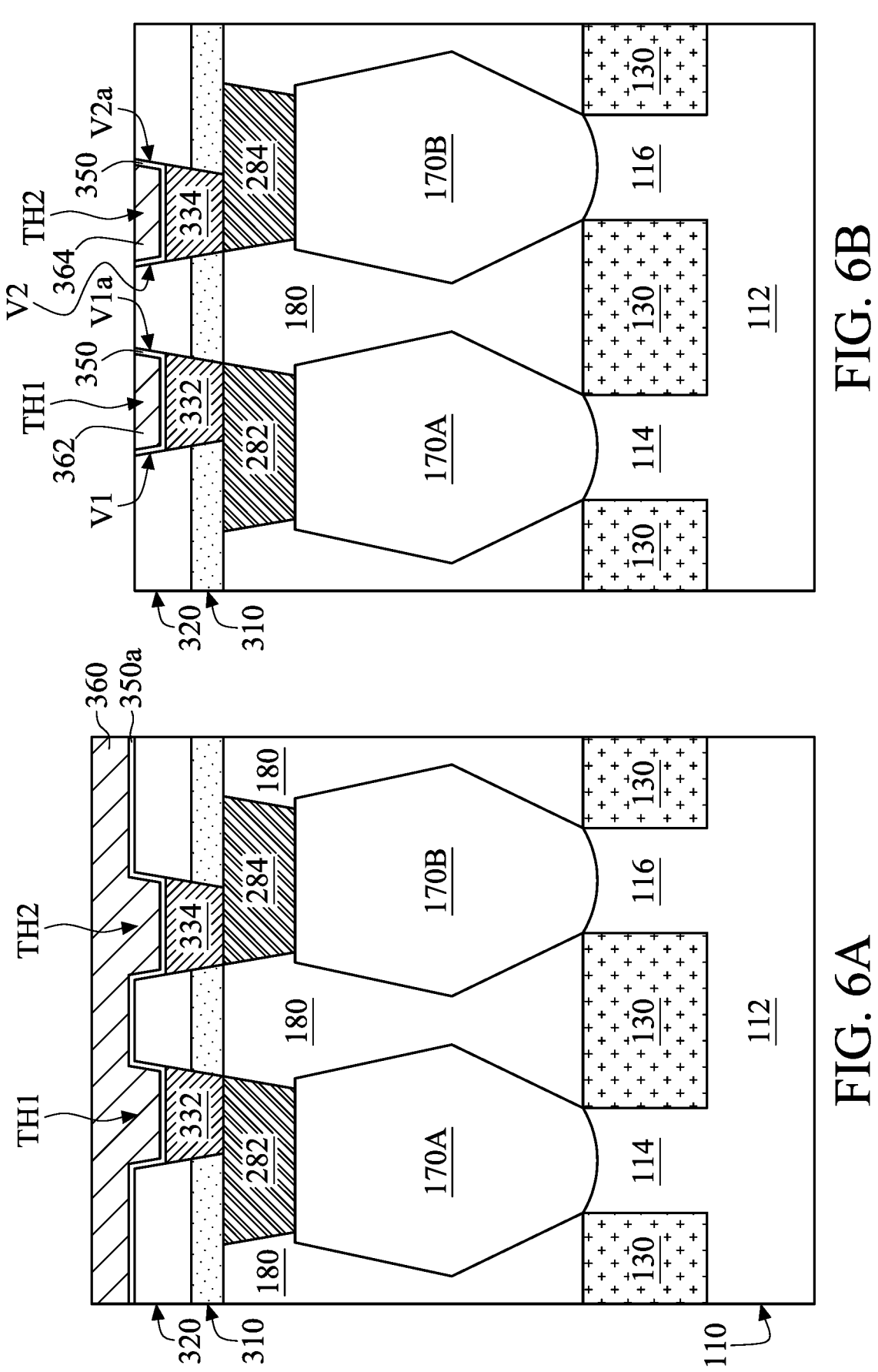
FIGS. 6A-6C are cross-sectional views of various stages of a process for forming a semiconductor device structure, in accordance with some embodiments.
Figures 6C, 7A:
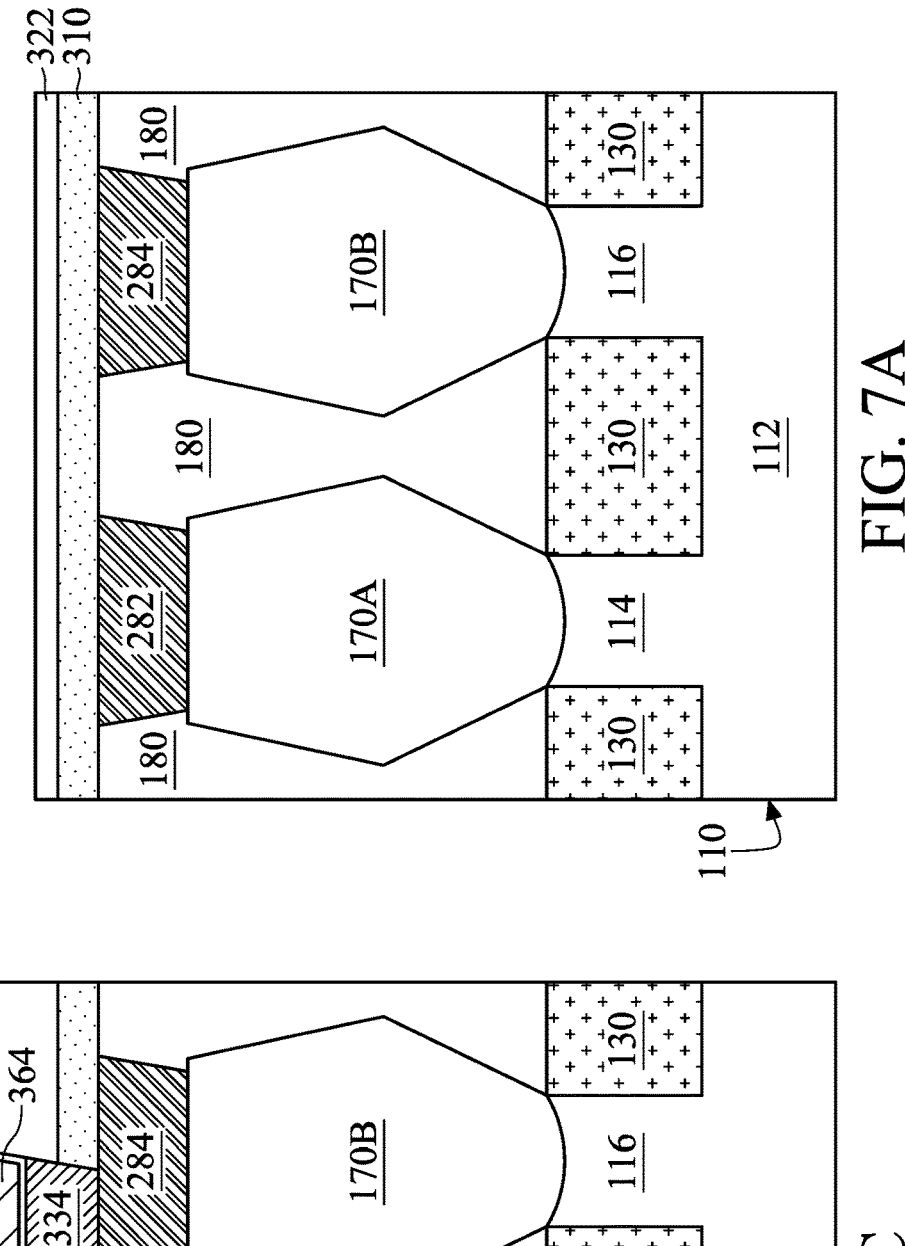
FIGS. 7A-7F are cross-sectional views of various stages of a process for forming a semiconductor device structure, in accordance with some embodiments.

FIGS. 6A-6C are cross-sectional views of various stages of a process for forming a semiconductor device structure, in accordance with some embodiments. As shown in FIG. 6A, after the step illustrated in FIG. 2E, steps illustrated in FIGS. 2G and 2I are performed to form the barrier material layer 350a and the conductive material layer 360, in accordance with some embodiments.

As shown in FIGS. 6A and 6B, portions of the conductive material layer 360 and the barrier material layer 350a outside of the through holes TH1 and TH2 are removed, in accordance with some embodiments. The conductive material layer 360 remaining in the through hole TH1 forms a conductive layer 362, in accordance with some embodiments. The barrier material layer 350a remaining in the through holes TH1 and TH2 forms a barrier layer 350, in accordance with some embodiments.

The conductive layer 362 is over the conductive via portion 332, in accordance with some embodiments. The barrier layer 350 in the through hole TH1 continuously surrounds the conductive layer 362, in accordance with some embodiments. The barrier layer 350 is between conductive layer 362 and the dielectric layer 320, in accordance with some embodiments. The barrier layer 350 is between the conductive layer 362 and the conductive via portion 332, in accordance with some embodiments.

The barrier layer 350 in the through hole TH1 and the conductive layer 362 together form a conductive via portion V1a, in accordance with some embodiments. The conductive via portions 332 and V1a together form a conductive via structure V1, in accordance with some embodiments. The conductive via structure V1 passes through the dielectric layer 320 and the etch stop layer 310, in accordance with some embodiments.

The conductive material layer 360 remaining in the through hole TH2 forms a conductive layer 364, in accordance with some embodiments. The conductive layer 364 is over the conductive via portion 334, in accordance with some embodiments. The barrier layer 350 in the through hole TH2 continuously surrounds the conductive layer 364, in accordance with some embodiments.

The barrier layer 350 is between the conductive layer 364 and the dielectric layer 320, in accordance with some embodiments. The barrier layer 350 is between the conductive layer 364 and the conductive via portion 334, in accordance with some embodiments.

The barrier layer 350 in the through hole TH2 and the conductive layer 364 together form a conductive via portion V2a, in accordance with some embodiments. The conductive via portions 334 and V2a together form a conductive via structure V2, in accordance with some embodiments. The conductive via structure V2 passes through the dielectric layer 320 and the etch stop layer 310, in accordance with some embodiments. The removal process includes a planarization process such as a chemical mechanical polishing (CMP) process, in accordance with some embodiments.

As shown in FIG. 6C, steps illustrated in FIGS. 2K and 2L are performed to form the etch stop layer 370, the dielectric layer 380, and the conductive lines 392 and 394, in accordance with some embodiments. In this step, a semiconductor device structure 600 is substantially formed, in accordance with some embodiments.

FIGS. 7A-7F are cross-sectional views of various stages of a process for forming a semiconductor device structure, in accordance with some embodiments. As shown in FIG.

7A, after the step illustrated in FIG. 2B, the step illustrated in FIG. 2C is performed to form the etch stop layer 310, in accordance with some embodiments.

As shown in FIG. 7A, a dielectric layer 322 is formed over the etch stop layer 310, in accordance with some embodiments. The dielectric layer 322 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

The dielectric layer 322 is formed using a deposition process, in accordance with some embodiments. The deposition process includes an atomic layer deposition (ALD) process, a chemical vapor deposition (CVD) process, or another applicable process.

Figures 7B, 7C:
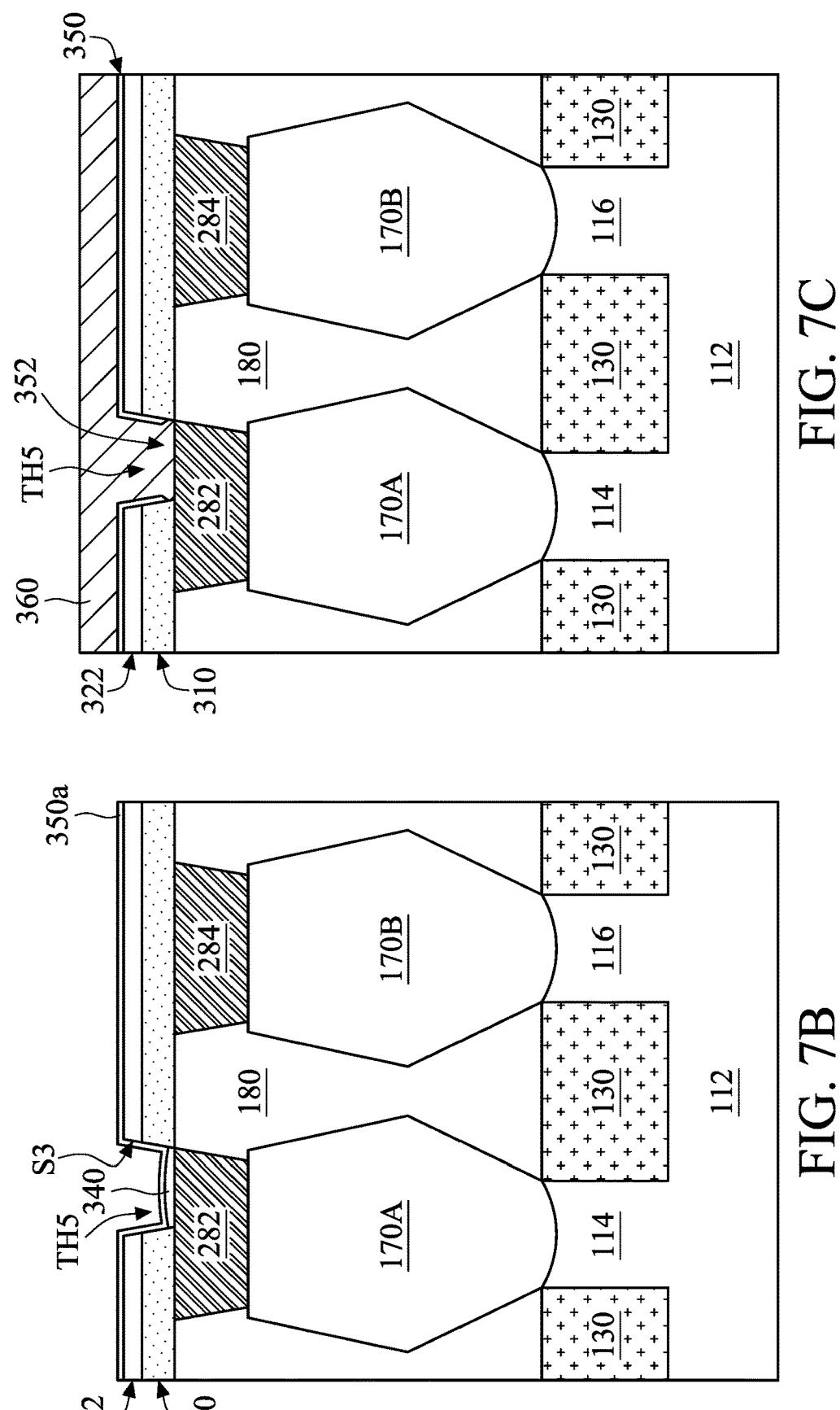

As shown in FIG. 7B, the dielectric layer 322 and the etch stop layer 310 are partially removed to form a through hole TH5 in the dielectric layer 322 and the etch stop layer 310, in accordance with some embodiments. The through hole TH5 expose a portion of the conductive structure 282, in accordance with some embodiments. The removal process includes an etching process such as a dry etching process, in accordance with some embodiments.

As shown in FIG. 7B, a sacrificial layer 340 is formed over the conductive structure 282, in accordance with some embodiments. The sacrificial layer 340 is made of a polymer material such as a bottom anti-reflective coating (BARC) material, in accordance with some embodiments. The BARC material includes carbon, oxygen, and nitrogen, in accordance with some embodiments. The sacrificial layer 340 is formed using a selective deposition process, in accordance with some embodiments. The selective deposition process includes an atomic layer deposition (ALD) process, in accordance with some embodiments.

As shown in FIG. 7B, a barrier material layer 350a is conformally deposited over the dielectric layer 322 and in the through hole TH5 to cover the inner walls S3 of the through hole TH5 and the sacrificial layer 340, in accordance with some embodiments. The barrier material layer 350a is made of metal nitrides such as TaN or TiN, in accordance with some embodiments.

The barrier material layer 350a is formed using a deposition process such as a chemical vapor deposition (CVD) process, an atomic layer deposition (ALD) process, or a physical vapor deposition (PVD) process, in accordance with some embodiments.

As shown in FIGS. 7B and 7C, the sacrificial layer 340 and portions of the barrier material layer 350a over the sacrificial layer 340 are removed to form an opening 352 in the barrier material layer 350a, in accordance with some embodiments. The opening 352 exposes the conductive structure 282, in accordance with some embodiments.

The barrier material layer 350a with the opening 352 forms a barrier layer 350, in accordance with some embodiments. The removal process includes an etching process such as a dry etching process (e.g. a plasma etching process), in accordance with some embodiments.

As shown in FIG. 7C, a conductive material layer 360 is formed over the barrier layer 350 and in the through hole TH5, in accordance with some embodiments. The conductive material layer 360 is made of a conductive material with an ultra-low resistance such as W, Co, Al, Pt, Ag, Ru, Cu, RuCo, Ru-alloy, Cu-alloy, another suitable metal material, or another suitable alloy material, in accordance with some embodiments.

The conductive material layer 360 is formed using a deposition process such as a chemical vapor deposition (CVD) process, an atomic layer deposition (ALD) process, or a physical vapor deposition (PVD) process, in accordance with some embodiments.

Figures 7D, 7E:
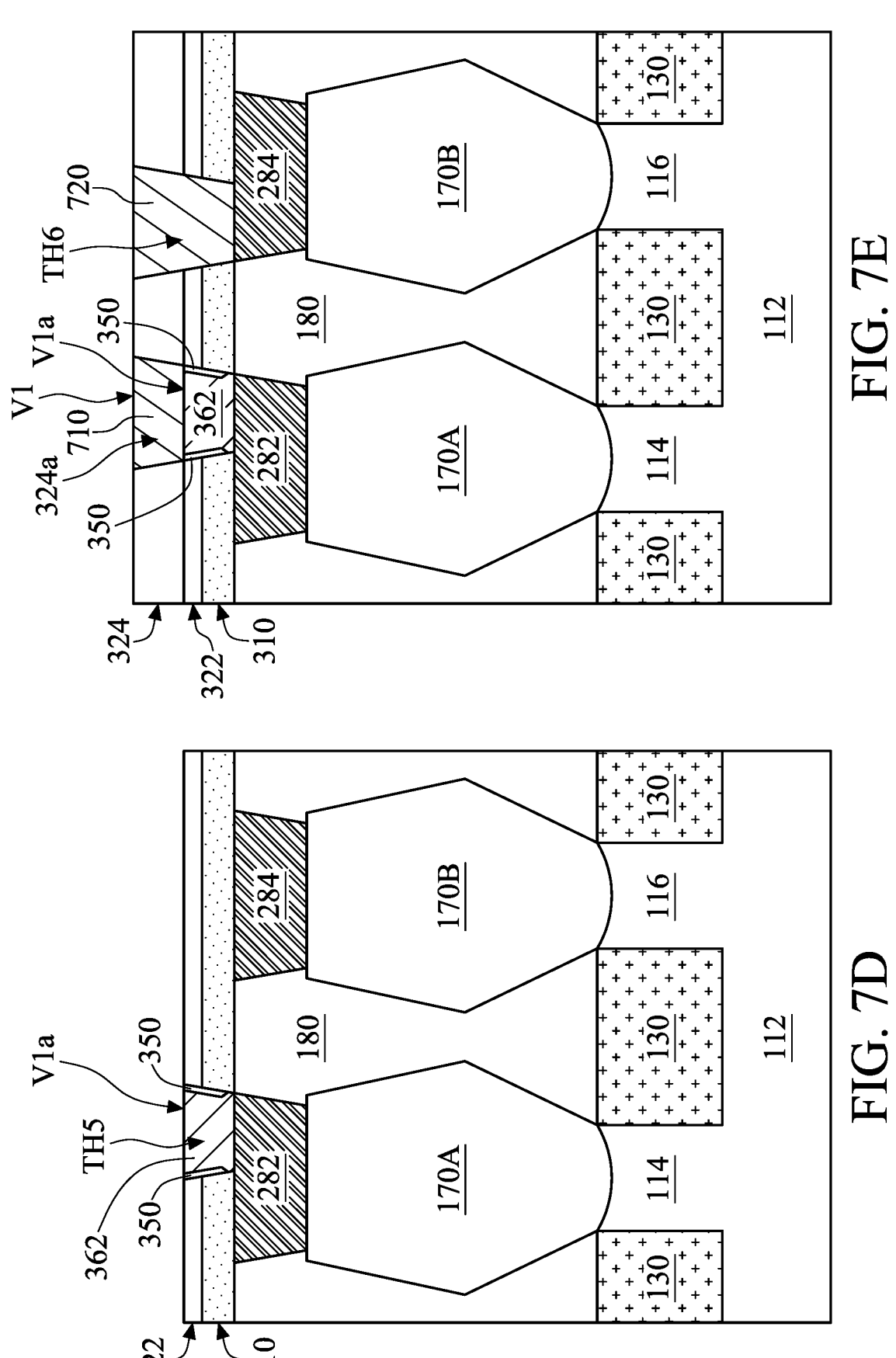

As shown in FIG. 7D, portions of the conductive material layer 360 and the barrier layer 350 outside of the through hole TH5 are removed, in accordance with some embodiments. The conductive material layer 360 remaining in the through hole TH5 forms a conductive layer 362, in accordance with some embodiments. The conductive layer 362 is over the conductive structure 282, in accordance with some embodiments. The barrier layer 350 continuously surrounds the conductive layer 362, in accordance with some embodiments.

The barrier layer 350 is between the conductive layer 362 and the dielectric layer 322, in accordance with some embodiments. The barrier layer 350 and the conductive layer 362 together form a conductive via portion V1a, in accordance with some embodiments. The removal process includes a planarization process such as a chemical mechanical polishing (CMP) process, in accordance with some embodiments.

As shown in FIG. 7E, a dielectric layer 324 is formed over the dielectric layer 322 and the conductive via portion V1a, in accordance with some embodiments. The dielectric layer 324 is made of an oxide-containing insulating material, such as silicon oxide, or a nitride-containing insulating material, such as silicon nitride, silicon oxynitride, silicon oxycarbonitride, or silicon carbonitride, in accordance with some embodiments.

The dielectric layer 324 is formed using a deposition process, in accordance with some embodiments. The deposition process includes an atomic layer deposition (ALD) process, a chemical vapor deposition (CVD) process, or another applicable process.

As shown in FIG. 7E, the dielectric layers 322 and 324 and the etch stop layer 310 are partially removed to form through holes 324a and TH6 in the dielectric layers 322 and 324 and the etch stop layer 310, in accordance with some embodiments. The through hole 324a exposes the conductive via portion V1a, in accordance with some embodiments. The through hole TH6 exposes a portion of the conductive structure 284, in accordance with some embodiments. The removal process includes an etching process such as a dry etching process, in accordance with some embodiments.

As shown in FIG. 7E, a conductive via portion 710 and a conductive via structure 720 are formed in the through holes 324a and TH6 respectively, in accordance with some embodiments. The conductive via portions 710 and V1a together form a conductive via structure V1, in accordance with some embodiments. The conductive via structure V1 passes through the dielectric layers 322 and 324 and the etch stop layer 310, in accordance with some embodiments.

The conductive via portion 710 and a conductive via structure 720 are made of a conductive material such as W, Co, another suitable metal material, or an alloy thereof, in accordance with some embodiments. The formation of the conductive via portion 710 and the conductive via structure 720 includes depositing a conductive material layer into the through holes 324a and TH6; and removing the conductive material layer outside of the through holes 324a and TH6, in accordance with some embodiments.

Figures 7F, 8:
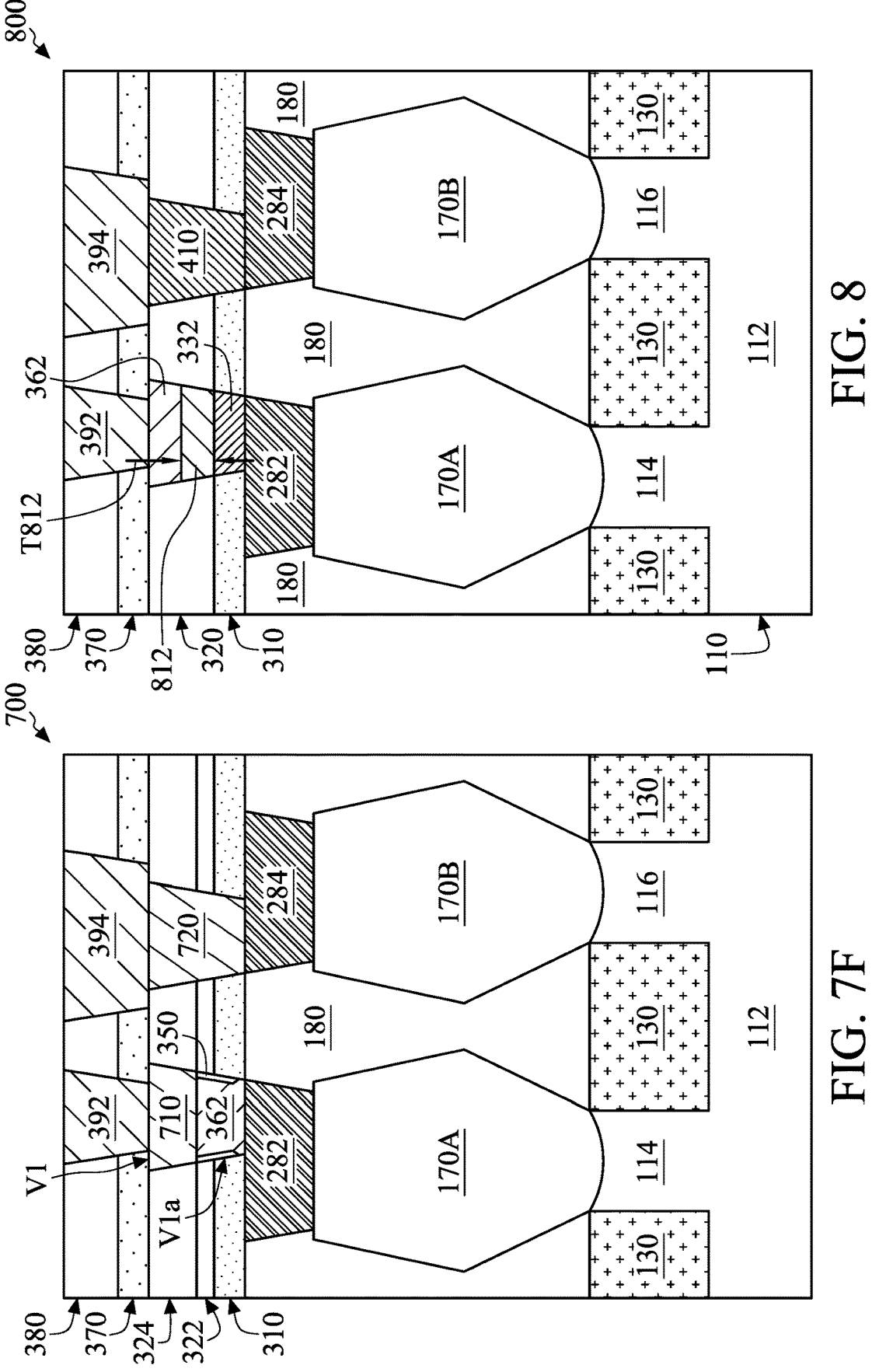
FIG. 8 is a cross-sectional view of a semiconductor device structure, in accordance with some embodiments.

As shown in FIG. 7F, the steps illustrated in FIGS. 2K and 2L are performed to form the etch stop layer 370, the dielectric layer 380, and the conductive lines 392 and 394, in accordance with some embodiments. In this step, a semiconductor device structure 700 is substantially formed, in accordance with some embodiments.

The overall diffusion rate of the conductive via portion V1a in the dielectric layer 322 and the etch stop layer 310 is lower than the overall diffusion rate of the conductive via portion 710 in the dielectric layer 324, in accordance with some embodiments. Therefore, leakage and shorts between the conductive via portion V1a and the conductive structure 284 are prevented, in accordance with some embodiments.

FIG. 8 is a cross-sectional view of a semiconductor device structure 800, in accordance with some embodiments. As shown in FIG. 8, the semiconductor device structure 800 is similar to the semiconductor device structure 500 of FIG. 5, except that the semiconductor device structure 800 further has a conductive via portion 812 between the conductive via portion 332 and the conductive layer 362, in accordance with some embodiments.

The thickness T812 of the conductive via portion 812 ranges from about 1 nm to about 50 nm, in accordance with some embodiments. The thickness T812 of the conductive via portion 812 ranges from about 2 nm to about 10 nm, in accordance with some embodiments.

The conductive via portion 812 is made of a conductive material with an ultra-low resistance such as W, Co, Al, Pt, Ag, Ru, Cu, RuCo, Ru-alloy, Cu-alloy, another suitable metal material, or another suitable alloy material, in accordance with some embodiments. The conductive via portion 812 is formed using a selective deposition process, in accordance with some embodiments. The selective deposition process includes an atomic layer deposition (ALD) process, in accordance with some embodiments.

In some embodiments, the conductive layer 362 and the conductive line 392 are made of similar or the same material to improve the adhesion between the conductive layer 362 and the conductive line 392. The conductive layer 362 is made of a conductive material such as Ru, Cu, W, Co, Al, Pt, Ag, RuCo, or an alloy thereof, in accordance with some embodiments.

In some embodiments, the conductive via portion 332 and the conductive structure 282 are made of similar or the same material to improve the adhesion between the conductive via portion 332 and the conductive structure 282. The conductive via portion 332 is made of W, Co, Al, Cu, or another suitable conductive material.

Figures 9, 10:
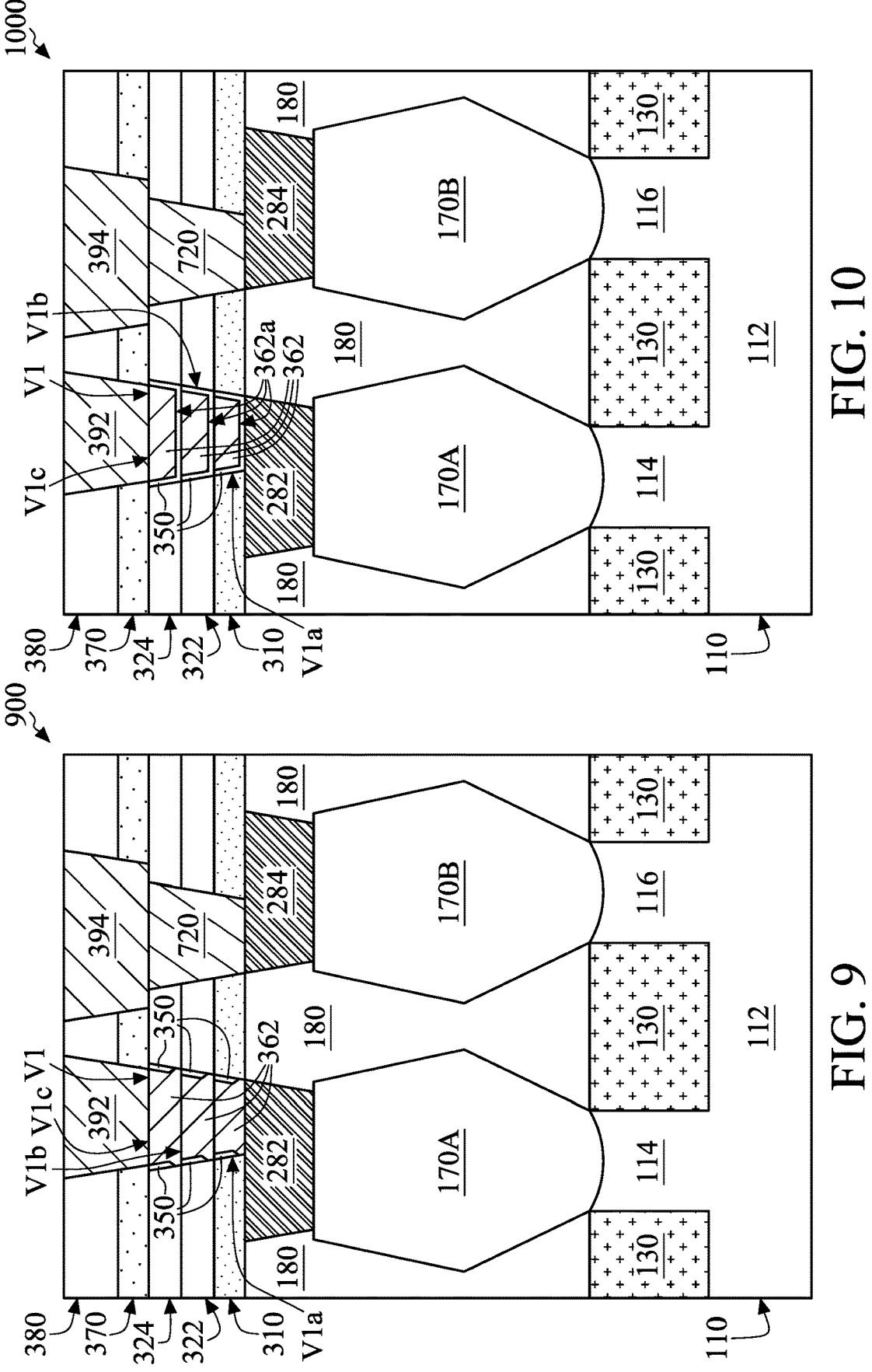
FIG. 9 is a cross-sectional view of a semiconductor device structure, in accordance with some embodiments.
FIG. 10 is a cross-sectional view of a semiconductor device structure, in accordance with some embodiments.

FIG. 9 is a cross-sectional view of a semiconductor device structure 900, in accordance with some embodiments. As shown in FIG. 9, the semiconductor device structure 900 is similar to the semiconductor device structure 700 of FIG. 7F, except that the semiconductor device structure 900 further has conductive via portions V1b and V1c to functionally replace the conductive via portion 710 of the semiconductor device structure 700 of FIG. 7F, in accordance with some embodiments.

Each of the conductive via portions V1a, V1b and V1c includes the conductive layer 362 and the barrier layer 350, in accordance with some embodiments. The barrier layer 350 continuously surrounds the conductive layer 362, in accordance with some embodiments. The conductive via portions V1a, V1b and V1c together form a conductive via structure V1, in accordance with some embodiments. The barrier layers 350 of the conductive via portions V1a, V1b and V1c are optional, in accordance with some embodiments.

FIG. 10 is a cross-sectional view of a semiconductor device structure 1000, in accordance with some embodiments. As shown in FIG. 10, the semiconductor device structure 1000 is similar to the semiconductor device structure 900 of FIG. 9, except that the barrier layer 350 of the semiconductor device structure 1000 covers the bottom surface 362*a* of the conductive layer 362 of each of the conductive via portions V1*a*, V1*b* and Vic, in accordance with some embodiments.

The barrier layer 350 of the conductive via portion V1*a* is between the conductive layer 362 and the conductive structure 282, in accordance with some embodiments. The barrier layer 350 of the conductive via portion V1*b* is between the conductive layer 362 of the conductive via portion V1*b* and the conductive layer 362 of the conductive via portion V1*a*, in accordance with some embodiments.

The barrier layer 350 of the conductive via portion V1*c* is between the conductive layer 362 of the conductive via portion V1*c* and the conductive layer 362 of the conductive via portion V1*b*, in accordance with some embodiments. The barrier layers 350 of the conductive via portions V1*a*, V1*b* and V1*c* are optional, in accordance with some embodiments.

In some other embodiments, the conductive via structure V1 is connected between the conductive lines or between the conductive line and a device.

Processes and materials for forming the semiconductor device structures 400, 500, 600, 700, 800, 900, and 1000 may be similar to, or the same as, those for forming the semiconductor device structure 300 described above. Elements designated by the same or similar reference numbers as those in FIGS. 1A to 10 have the same or similar structures and the materials. Therefore, the detailed descriptions thereof will not be repeated herein.

The top views of the semiconductor structures 300, 400, 500, 600, 700, 800, 900, and 1000 are similar to or the same as each other, in accordance with some embodiments.

In accordance with some embodiments, semiconductor device structures and methods for forming the same are provided. The methods (for forming the semiconductor device structure) form a conductive via structure having a first portion and a second portion over the first portion, and the first overall diffusion rate of the second portion in a dielectric layer is lower than a second overall diffusion rate of the first portion in the dielectric layer. Therefore, leakage and shorts between the second portion and an adjacent conductive line are prevented. As a result, the reliability of the semiconductor device structure is improved.

In accordance with some embodiments, a method for forming a semiconductor device structure is provided. The method includes providing a conductive structure. The method includes forming a first dielectric layer over the conductive structure. The method includes forming a conductive via structure passing through the first dielectric layer. The conductive via structure is over and connected to the conductive structure, the conductive via structure has a first portion and a second portion over the first portion, and a first overall diffusion rate of the second portion in the first dielectric layer is lower than a second overall diffusion rate of the first portion in the first dielectric layer. The method includes forming a second dielectric layer over the conductive via structure and the first dielectric layer. The method includes forming a conductive line passing through the second dielectric layer. The conductive line is over and connected to the conductive via structure.

In accordance with some embodiments, a method for forming a semiconductor device structure is provided. The method includes providing a conductive structure. The method includes forming a first dielectric layer over the conductive structure. The method includes forming a conductive via structure passing through the first dielectric layer. The conductive via structure is over and connected to the conductive structure, the conductive via structure has a first portion and a second portion over the first portion, and a first overall diffusion rate of the first portion in the first dielectric layer is lower than a second overall diffusion rate of the second portion in the first dielectric layer. The method includes forming a second dielectric layer over the conductive via structure and the first dielectric layer. The method includes forming a conductive line passing through the second dielectric layer. The conductive line is over and connected to the conductive via structure.

In accordance with some embodiments, a semiconductor device structure is provided. The semiconductor device structure includes a conductive structure. The semiconductor device structure includes a first dielectric layer over the conductive structure. The semiconductor device structure includes a conductive via structure over and connected to the conductive structure. The conductive via structure passes through the first dielectric layer, the conductive via structure has a first portion and a second portion over the first portion, and a first overall diffusion rate of the second portion in the first dielectric layer is lower than a second overall diffusion rate of the first portion in the first dielectric layer. The semiconductor device structure includes a second dielectric layer over the conductive via structure and the first dielectric layer. The semiconductor device structure includes a conductive line over and connected to the conductive via structure. The semiconductor device structure passes through the second dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

providing a conductive structure;

forming a first dielectric layer over the conductive structure;

forming a conductive via structure passing through the first dielectric layer, wherein the conductive via structure is over and connected to the conductive structure, the conductive via structure has a first portion and a second portion over the first portion, and a first overall diffusion rate of the second portion in the first dielectric layer is lower than a second overall diffusion rate of the first portion in the first dielectric layer, wherein a first resistance of the first portion of the conductive via structure is different from a second resistance of the second portion of the conductive via structure;

forming a second dielectric layer over the conductive via structure and the first dielectric layer; and forming a conductive line passing through the second dielectric layer, wherein the conductive line is over and connected to the conductive via structure.

2. The method for forming the semiconductor device structure as claimed in claim 1, wherein the second portion comprises a conductive layer and a barrier layer surrounding the conductive layer.

3. The method for forming the semiconductor device structure as claimed in claim 2, wherein the barrier layer is between the conductive layer and the first dielectric layer.

4. The method for forming the semiconductor device structure as claimed in claim 3, wherein the forming of the conductive via structure passing through the first dielectric layer comprises:

partially removing the first dielectric layer to form a through hole in the first dielectric layer, wherein the through hole exposes a third portion of the conductive structure;

performing a selective deposition process over the third portion of the conductive structure to form the first portion of the conductive via structure;

forming the barrier layer in the through hole and covering an inner wall of the through hole; and filling the through hole with the conductive layer, wherein the conductive layer is over the first portion of the conductive via structure.

5. The method for forming the semiconductor device structure as claimed in claim 4, wherein the forming of the barrier layer in the through hole and covering the inner wall of the through hole comprises:

forming a sacrificial layer over the first portion of the conductive via structure;

depositing a barrier material layer in the through hole to cover the inner wall of the through hole and the sacrificial layer; and removing the sacrificial layer and a fourth portion of the barrier material layer over the sacrificial layer to form an opening in the barrier material layer, wherein the opening exposes the first portion of the conductive via structure.

6. The method for forming the semiconductor device structure as claimed in claim 3, wherein the barrier layer is further between the conductive layer and the first portion of the conductive via structure.

7. The method for forming the semiconductor device structure as claimed in claim 6, wherein the forming of the conductive via structure passing through the first dielectric layer comprises:

partially removing the first dielectric layer to form a through hole in the first dielectric layer, wherein the through hole exposes a third portion of the conductive structure;

performing a selective deposition process over the third portion of the conductive structure to form the first portion of the conductive via structure;

depositing the barrier layer in the through hole to cover an inner wall of the through hole and the first portion of the conductive via structure; and filling the through hole with the conductive layer, wherein the conductive layer is over the barrier layer.

8. The method for forming the semiconductor device structure as claimed in claim 1, wherein the forming of the conductive via structure passing through the first dielectric layer comprises:

partially removing the first dielectric layer to form a through hole in the first dielectric layer, wherein the through hole exposes a third portion of the conductive structure;

performing a first selective deposition process over the third portion of the conductive structure to form the first portion of the conductive via structure; and performing a second selective deposition process over the first portion of the conductive via structure to form the second portion of the conductive via structure.

9. The method for forming the semiconductor device structure as claimed in claim 8, wherein the first resistance of the first portion of the conductive via structure is lower than the second resistance of the second portion of the conductive via structure.

10. The method for forming the semiconductor device structure as claimed in claim 8, wherein the second portion of the conductive via structure comprises molybdenum.

11. A method for forming a semiconductor device structure, comprising:

providing a conductive structure;

forming a first dielectric layer over the conductive structure;

forming a conductive via structure passing through the first dielectric layer, wherein the conductive via structure is over and connected to the conductive structure, the conductive via structure has a first portion and a second portion over the first portion, and a first overall diffusion rate of the first portion in the first dielectric layer is lower than a second overall diffusion rate of the second portion in the first dielectric layer;

forming a second dielectric layer over the conductive via structure and the first dielectric layer; and forming a conductive line passing through the second dielectric layer, wherein the conductive line is over and connected to the conductive via structure.

12. The method for forming the semiconductor device structure as claimed in claim 11, wherein the first portion comprises a conductive layer and a barrier layer surrounding the conductive layer.

13. The method for forming the semiconductor device structure as claimed in claim 12, wherein the barrier layer is between the conductive layer and the first dielectric layer.

14. The method for forming the semiconductor device structure as claimed in claim 13, wherein the barrier layer is further between the conductive layer and the conductive structure.

15. The method for forming the semiconductor device structure as claimed in claim 11, wherein the forming of the conductive via structure passing through the first dielectric layer comprises:

partially removing the first dielectric layer to form a through hole in the first dielectric layer, wherein the through hole exposes a third portion of the conductive structure;

performing a first selective deposition process over the third portion of the conductive structure to form the first portion of the conductive via structure; and performing a second selective deposition process over the first portion of the conductive via structure to form the second portion of the conductive via structure, wherein the first portion and the second portion are made of different materials.

16. A semiconductor device structure, comprising:

a conductive structure;

a first dielectric layer over the conductive structure;

a conductive via structure over and connected to the conductive structure, wherein the conductive via structure passes through the first dielectric layer, the conductive via structure has a first portion and a second portion over the first portion, and a first overall diffusion rate of the second portion in the first dielectric layer is lower than a second overall diffusion rate of the first portion in the first dielectric layer, wherein a first resistance of the first portion of the conductive via structure is lower than a second resistance of the second portion of the conductive via structure;

a second dielectric layer over the conductive via structure and the first dielectric layer; and a conductive line over and connected to the conductive via structure and passing through the second dielectric layer.

17. The semiconductor device structure as claimed in claim 16, wherein the second portion comprises a conductive layer and a barrier layer surrounding the conductive layer.

18. The semiconductor device structure as claimed in claim 17, wherein the barrier layer is between the conductive layer and the first dielectric layer.

19. The semiconductor device structure as claimed in claim 18, wherein the barrier layer is further between the conductive layer and the first portion of the conductive via structure.

20. The semiconductor device structure as claimed in claim 16, wherein the first portion of the conductive via structure is thicker than the second portion of the conductive via structure.

* * * * *